(12) United States Patent
Pinarbasi et al.

(10) Patent No.: US 10,777,736 B2
(45) Date of Patent: Sep. 15, 2020

(54) POLISHING STOP LAYER(S) FOR PROCESSING ARRAYS OF SEMICONDUCTOR ELEMENTS

(71) Applicant: Spin Memory, Inc., Fremont, CA (US)

(72) Inventors: Mustafa Michael Pinarbasi, Morgan Hill, CA (US); Jacob Anthony Hernandez, Morgan Hill, CA (US); Arindom Datta, Syosset, NY (US); Marcin Jan Gajek, Berkeley, CA (US); Parshuram Balkrishna Zantye, Morganville, NY (US)

(73) Assignee: Spin Memory, Inc., Fremont, CA (US)

( * ) Notice: Subject to any disclaimer, the term of this patent is extended or adjusted under 35 U.S.C. 154(b) by 0 days.

(21) Appl. No.: 15/674,620

(22) Filed: Aug. 11, 2017

(65) Prior Publication Data

US 2017/0346002 A1    Nov. 30, 2017

Related U.S. Application Data

(62) Division of application No. 15/097,576, filed on Apr. 13, 2016, now Pat. No. 9,773,974.

(Continued)

(51) Int. Cl.
*H01L 43/12* (2006.01)
*H01L 43/08* (2006.01)
(Continued)

(52) U.S. Cl.
CPC ............ *H01L 43/12* (2013.01); *H01L 27/222* (2013.01); *H01L 43/02* (2013.01); *H01L 43/08* (2013.01)

(58) Field of Classification Search
CPC ........ H01L 43/12; H01L 43/08; H01L 27/222
See application file for complete search history.

(56) References Cited

U.S. PATENT DOCUMENTS 341,801 A     5/1986  Fox
5,541,868 A   7/1996  Prinz
(Continued)

FOREIGN PATENT DOCUMENTS

CA    2766141 A1    1/2011
CN    101036195 A   9/2008
(Continued)

OTHER PUBLICATIONS

US 7,026,672 B2, 04/2006, Pakala et al. (withdrawn)
(Continued)

*Primary Examiner* — Vongsavanh Sengdara
(74) *Attorney, Agent, or Firm* — Arnold & Porter Kaye Scholer

(57) ABSTRACT

Described embodiments can be used in semiconductor manufacturing and employ materials with high and low polish rates to help determine a precise polish end point that is consistent throughout a wafer and that can cease polishing prior to damaging semiconductor elements. The height of the low polish rate material between the semiconductor elements is used as the polishing endpoint. Because the low polish rate material slows down the polishing process, it is easy to determine an end point and avoid damage to the semiconductor elements. An additional or alternative etch end point can be a thin layer of material that provides a very clear spectroscopy signal when it has been exposed, allowing the etch process to cease.

8 Claims, 16 Drawing Sheets

Related U.S. Application Data

(60) Provisional application No. 62/198,870, filed on Jul. 30, 2015.

(51) Int. Cl.
  H01L 27/22 (2006.01)
  H01L 43/02 (2006.01)

(56) References Cited

U.S. PATENT DOCUMENTS

| | | |
|---|---|---|
| 5,629,549 A | 5/1997 | Johnson |
| 5,640,343 A | 6/1997 | Gallagher et al. |
| 5,654,566 A | 8/1997 | Johnson |
| 5,691,936 A | 11/1997 | Sakakima et al. |
| 5,695,846 A | 12/1997 | Lange et al. |
| 5,695,864 A | 12/1997 | Slonczewski |
| 5,732,016 A | 3/1998 | Chen et al. |
| 5,856,897 A | 1/1999 | Mauri |
| 5,896,252 A | 4/1999 | Kanai |
| 5,966,323 A | 10/1999 | Chen et al. |
| 6,016,269 A | 1/2000 | Peterson et al. |
| 6,055,179 A | 4/2000 | Koganei et al. |
| 6,097,579 A | 8/2000 | Gill |
| 6,124,711 A | 9/2000 | Tanaka et al. |
| 6,134,138 A | 10/2000 | Lu et al. |
| 6,140,838 A | 10/2000 | Johnson |
| 6,154,349 A | 11/2000 | Kanai et al. |
| 6,172,902 B1 | 1/2001 | Wegrowe et al. |
| 6,233,172 B1 | 5/2001 | Chen et al. |
| 6,243,288 B1 | 6/2001 | Ishikawa et al. |
| 6,252,798 B1 | 6/2001 | Satoh et al. |
| 6,256,223 B1 | 7/2001 | Sun |
| 6,292,389 B1 | 9/2001 | Chen et al. |
| 6,347,049 B1 | 2/2002 | Childress et al. |
| 6,376,260 B1 | 4/2002 | Chen et al. |
| 6,385,082 B1 | 5/2002 | Abraham et al. |
| 6,436,526 B1 | 8/2002 | Odagawa et al. |
| 6,458,603 B1 | 10/2002 | Kersch et al. |
| 6,493,197 B2 | 12/2002 | Ito et al. |
| 6,522,137 B1 | 2/2003 | Sun et al. |
| 6,532,164 B2 | 3/2003 | Redon et al. |
| 6,538,918 B2 | 3/2003 | Swanson et al. |
| 6,545,906 B1 | 4/2003 | Savtchenko et al. |
| 6,563,681 B1 | 5/2003 | Sasaki et al. |
| 6,566,246 B1 | 5/2003 | deFelipe et al. |
| 6,603,677 B2 | 8/2003 | Redon et al. |
| 6,653,153 B2 | 11/2003 | Doan et al. |
| 6,654,278 B1 | 11/2003 | Engel et al. |
| 6,677,165 B1 | 1/2004 | Lu et al. |
| 6,710,984 B1 | 3/2004 | Yuasa et al. |
| 6,713,195 B2 | 3/2004 | Wang et al. |
| 6,714,444 B2 | 3/2004 | Huai et al. |
| 6,744,086 B2 | 6/2004 | Daughton et al. |
| 6,750,491 B2 | 6/2004 | Sharma et al. |
| 6,765,824 B2 | 7/2004 | Kishi et al. |
| 6,772,036 B2 | 8/2004 | Eryurek et al. |
| 6,773,515 B2 | 8/2004 | Li et al. |
| 6,777,730 B2 | 8/2004 | Daughton et al. |
| 6,785,159 B2 | 8/2004 | Tuttle |
| 6,812,437 B2 | 11/2004 | Levy et al. |
| 6,829,161 B2 | 12/2004 | Huai et al. |
| 6,835,423 B2 | 12/2004 | Chen et al. |
| 6,838,740 B2 | 1/2005 | Huai et al. |
| 6,842,317 B2 | 1/2005 | Sugita et al. |
| 6,847,547 B2 | 1/2005 | Albert et al. |
| 6,887,719 B2 | 5/2005 | Lu et al. |
| 6,888,742 B1 | 5/2005 | Nguyen et al. |
| 6,902,807 B1 | 6/2005 | Argoitia et al. |
| 6,906,369 B2 | 6/2005 | Ross et al. |
| 6,920,063 B2 | 7/2005 | Huai et al. |
| 6,933,155 B2 | 8/2005 | Albert et al. |
| 6,958,927 B1 | 10/2005 | Nguyen et al. |
| 6,967,863 B2 | 11/2005 | Huai |
| 6,980,469 B2 | 12/2005 | Kent et al. |
| 6,985,385 B2 | 1/2006 | Nguyen et al. |
| 6,992,359 B2 | 1/2006 | Nguyen et al. |
| 6,995,962 B2 | 2/2006 | Saito et al. |
| 7,002,839 B2 | 2/2006 | Kawabata et al. |
| 7,005,958 B2 | 2/2006 | Wan |
| 7,006,375 B2 | 2/2006 | Covington |
| 7,009,877 B1 | 3/2006 | Huai et al. |
| 7,041,598 B2 | 5/2006 | Sharma |
| 7,045,368 B2 | 5/2006 | Hong et al. |
| 7,149,106 B2 | 12/2006 | Mancoff et al. |
| 7,170,778 B2 | 1/2007 | Kent et al. |
| 7,190,611 B2 | 3/2007 | Nguyen et al. |
| 7,203,129 B2 | 4/2007 | Lin et al. |
| 7,227,773 B1 | 6/2007 | Nguyen et al. |
| 7,262,941 B2 | 8/2007 | Li et al. |
| 7,307,876 B2 | 12/2007 | Kent et al. |
| 7,324,387 B1 | 1/2008 | Bergemont et al. |
| 7,335,960 B2 | 2/2008 | Han et al. |
| 7,351,594 B2 | 4/2008 | Bae et al. |
| 7,352,021 B2 | 4/2008 | Bae et al. |
| 7,376,006 B2 | 5/2008 | Bednorz et al. |
| 7,378,699 B2 | 5/2008 | Chan et al. |
| 7,449,345 B2 | 11/2008 | Horng et al. |
| 7,476,919 B2 | 1/2009 | Hong et al. |
| 7,502,249 B1 | 3/2009 | Ding |
| 7,573,737 B2 | 8/2009 | Kent et al. |
| 7,598,555 B1 | 10/2009 | Papworth-Parkin |
| 7,619,431 B2 | 11/2009 | DeWilde et al. |
| 7,630,232 B2 | 12/2009 | Guo |
| 7,643,332 B2 | 1/2010 | Leuschner |
| 7,679,155 B2 | 3/2010 | Korenivski |
| 7,911,832 B2 | 3/2011 | Kent et al. |
| 7,936,595 B2 | 5/2011 | Han et al. |
| 7,986,544 B2 | 7/2011 | Kent et al. |
| 8,014,193 B2 | 9/2011 | Nakayama et al. |
| 8,279,663 B2 | 10/2012 | Nakayama |
| 8,279,666 B2 | 10/2012 | Dieny et al. |
| 8,334,213 B2 | 12/2012 | Mao |
| 8,357,982 B2 | 1/2013 | Kajiyama |
| 8,363,465 B2 | 1/2013 | Kent et al. |
| 8,456,883 B1 | 6/2013 | Liu |
| 8,488,375 B2 | 7/2013 | Saida et al. |
| 8,492,881 B2 | 7/2013 | Kuroiwa et al. |
| 8,508,979 B2 | 8/2013 | Saida et al. |
| 8,535,952 B2 | 9/2013 | Ranjan et al. |
| 8,574,928 B2 | 11/2013 | Satoh et al. |
| 8,576,616 B2 | 11/2013 | Saida et al. |
| 8,582,355 B2 | 11/2013 | Saida et al. |
| 8,617,408 B2 | 12/2013 | Balamane |
| 8,716,817 B2 | 5/2014 | Saida et al. |
| 8,737,122 B2 | 5/2014 | Saida et al. |
| 8,737,137 B1 | 5/2014 | Choy et al. |
| 8,779,537 B2 | 7/2014 | Huai |
| 8,823,118 B2 | 9/2014 | Horng |
| 8,852,760 B2 | 10/2014 | Wang et al. |
| 8,860,156 B2 | 10/2014 | Beach |
| 8,878,317 B2 | 11/2014 | Daibou et al. |
| 9,019,754 B1 | 4/2015 | Bedeschi |
| 9,025,368 B2 | 5/2015 | Saida et al. |
| 9,082,888 B2 | 7/2015 | Kent et al. |
| 9,117,995 B2 | 8/2015 | Daibou et al. |
| 9,129,690 B2 | 9/2015 | Park et al. |
| 9,159,342 B2 | 10/2015 | Kudo et al. |
| 9,245,608 B2 | 1/2016 | Chen et al. |
| 9,263,667 B1 | 2/2016 | Pinarbasi |
| 9,299,918 B2 | 3/2016 | Daibou et al. |
| 9,337,412 B2 | 3/2016 | Pinarbasi et al. |
| 9,362,486 B2 | 6/2016 | Kim et al. |
| 9,378,817 B2 | 6/2016 | Lee et al. |
| 9,379,314 B2 | 6/2016 | Park |
| 9,406,876 B2 | 8/2016 | Pinarbasi |
| 9,472,282 B2 | 10/2016 | Lee et al. |
| 9,472,748 B2 | 10/2016 | Kuo et al. |
| 9,484,527 B2 | 11/2016 | Han et al. |
| 9,548,445 B2 | 1/2017 | Lee et al. |
| 9,589,616 B2 | 3/2017 | Meng et al. |
| 9,728,712 B2 | 8/2017 | Kardasz et al. |
| 9,741,926 B1 | 8/2017 | Pinarbasi et al. |
| 9,773,540 B2 | 9/2017 | Zang et al. |
| 9,773,974 B2 | 9/2017 | Pinarbasi et al. |

(56) References Cited

U.S. PATENT DOCUMENTS

| | | |
|---|---|---|
| 9,777,974 B2 | 10/2017 | Kamitani et al. |
| 9,818,464 B2 | 11/2017 | Saida et al. |
| 9,853,206 B2 | 12/2017 | Pinarbasi et al. |
| 10,008,248 B2 | 6/2018 | Buhrman et al. |
| 10,026,892 B2 | 7/2018 | Pinarbasi et al. |
| 10,032,978 B1 | 7/2018 | Schabes et al. |
| 10,229,724 B1 | 3/2019 | el Baraji et al. |
| 10,236,047 B1 | 3/2019 | Ryan et al. |
| 10,236,048 B1 | 3/2019 | Tzoufras et al. |
| 10,236,439 B1 | 3/2019 | Schabes et al. |
| 10,270,027 B1 | 4/2019 | Gajek et al. |
| 10,360,961 B1 | 7/2019 | Tzoufras et al. |
| 10,468,588 B2 | 11/2019 | Schabes et al. |
| 10,468,590 B2 | 11/2019 | Kardasz et al. |
| 10,580,827 B1 | 3/2020 | Watts et al. |
| 10,615,335 B2 | 4/2020 | Kardasz et al. |
| 10,643,680 B2 | 5/2020 | Pinarbasi et al. |
| 2002/0090533 A1 | 7/2002 | Zhang et al. |
| 2002/0105823 A1 | 8/2002 | Redon et al. |
| 2002/0132140 A1 | 9/2002 | Igarashi et al. |
| 2003/0117840 A1 | 6/2003 | Sharma et al. |
| 2003/0151944 A1 | 8/2003 | Saito |
| 2003/0197984 A1 | 10/2003 | Inomata et al. |
| 2003/0218903 A1 | 11/2003 | Luo |
| 2004/0012994 A1 | 1/2004 | Slaughter et al. |
| 2004/0061154 A1 | 4/2004 | Huai et al. |
| 2004/0094785 A1 | 5/2004 | Zhu et al. |
| 2004/0125649 A1 | 7/2004 | Durlam et al. |
| 2004/0130936 A1 | 7/2004 | Nguyen et al. |
| 2004/0257717 A1 | 12/2004 | Sharma et al. |
| 2005/0041342 A1 | 2/2005 | Huai et al. |
| 2005/0051820 A1 | 3/2005 | Stojakovic et al. |
| 2005/0063222 A1 | 3/2005 | Huai et al. |
| 2005/0104101 A1 | 5/2005 | Sun et al. |
| 2005/0128842 A1 | 6/2005 | Wei |
| 2005/0136600 A1 | 6/2005 | Huai |
| 2005/0158881 A1 | 7/2005 | Sharma |
| 2005/0174702 A1 | 8/2005 | Gill |
| 2005/0180202 A1 | 8/2005 | Huai et al. |
| 2005/0184839 A1 | 8/2005 | Nguyen et al. |
| 2005/0201023 A1 | 9/2005 | Huai et al. |
| 2005/0237787 A1 | 10/2005 | Huai et al. |
| 2005/0280058 A1 | 12/2005 | Pakala et al. |
| 2006/0002184 A1 | 1/2006 | Hong et al. |
| 2006/0018057 A1 | 1/2006 | Huai |
| 2006/0044703 A1 | 3/2006 | Inomata et al. |
| 2006/0049472 A1 | 3/2006 | Diao et al. |
| 2006/0087880 A1 | 4/2006 | Mancoff et al. |
| 2006/0092696 A1 | 5/2006 | Bessho |
| 2006/0132990 A1 | 6/2006 | Morise et al. |
| 2006/0227465 A1 | 10/2006 | Inokuchi et al. |
| 2007/0019337 A1 | 1/2007 | Apalkov et al. |
| 2007/0030728 A1 | 2/2007 | Kent et al. |
| 2007/0047294 A1 | 3/2007 | Panchula |
| 2007/0096229 A1 | 5/2007 | Yoshikawa et al. |
| 2007/0242501 A1 | 10/2007 | Hung et al. |
| 2007/0297220 A1 | 12/2007 | Yoshikawa et al. |
| 2008/0031035 A1 | 2/2008 | Rodmacq et al. |
| 2008/0049488 A1 | 2/2008 | Rizzo |
| 2008/0112094 A1 | 5/2008 | Kent et al. |
| 2008/0151442 A1 | 6/2008 | Mauri et al. |
| 2008/0151614 A1 | 6/2008 | Guo |
| 2008/0164547 A1 | 7/2008 | Higo et al. |
| 2008/0185670 A1 | 8/2008 | Kajiyama |
| 2008/0259508 A2 | 10/2008 | Kent et al. |
| 2008/0273274 A1 | 11/2008 | Kojima et al. |
| 2008/0297292 A1 | 12/2008 | Viola et al. |
| 2009/0015958 A1 | 1/2009 | Nakamura et al. |
| 2009/0046501 A1 | 2/2009 | Ranjan et al. |
| 2009/0072185 A1 | 3/2009 | Raksha et al. |
| 2009/0091037 A1 | 4/2009 | Assefa et al. |
| 2009/0098413 A1 | 4/2009 | Kanegae |
| 2009/0161421 A1 | 6/2009 | Cho et al. |
| 2009/0209050 A1* | 8/2009 | Wang .................. H01L 43/12 438/3 |
| 2009/0209102 A1 | 8/2009 | Zhong et al. |
| 2009/0231909 A1 | 9/2009 | Dieny et al. |
| 2009/0244792 A1 | 10/2009 | Nakayama et al. |
| 2010/0019333 A1 | 1/2010 | Zhao et al. |
| 2010/0124091 A1 | 5/2010 | Cowburn |
| 2010/0193891 A1 | 8/2010 | Wang et al. |
| 2010/0232206 A1 | 9/2010 | Li et al. |
| 2010/0246254 A1 | 9/2010 | Prejbeanu et al. |
| 2010/0271870 A1 | 10/2010 | Zheng et al. |
| 2010/0290275 A1 | 11/2010 | Park et al. |
| 2010/0304204 A1 | 12/2010 | Routkevitch et al. |
| 2011/0001108 A1 | 1/2011 | Greene et al. |
| 2011/0032645 A1 | 2/2011 | Noel et al. |
| 2011/0058412 A1 | 3/2011 | Zheng et al. |
| 2011/0089511 A1 | 4/2011 | Keshtbod et al. |
| 2011/0133298 A1 | 6/2011 | Chen et al. |
| 2011/0141804 A1 | 6/2011 | Apalkov et al. |
| 2011/0149632 A1 | 6/2011 | Chen et al. |
| 2011/0216436 A1 | 9/2011 | Igarashi |
| 2011/0235217 A1* | 9/2011 | Chen .................. H01L 43/12 360/324.2 |
| 2011/0305077 A1 | 12/2011 | Higo et al. |
| 2012/0012952 A1 | 1/2012 | Chen et al. |
| 2012/0052258 A1 | 3/2012 | Op DeBeeck et al. |
| 2012/0069649 A1 | 3/2012 | Ranjan et al. |
| 2012/0120520 A1 | 5/2012 | Childress et al. |
| 2012/0155156 A1 | 6/2012 | Watts |
| 2012/0181642 A1 | 7/2012 | Prejbeanu et al. |
| 2012/0188818 A1 | 7/2012 | Ranjan et al. |
| 2012/0228728 A1 | 9/2012 | Ueki et al. |
| 2012/0280336 A1 | 11/2012 | Jan |
| 2012/0280339 A1 | 11/2012 | Zhang et al. |
| 2012/0294078 A1 | 11/2012 | Kent et al. |
| 2012/0299133 A1 | 11/2012 | Son et al. |
| 2013/0001506 A1 | 1/2013 | Sato et al. |
| 2013/0001652 A1 | 1/2013 | Yoshikawa et al. |
| 2013/0021841 A1 | 1/2013 | Zhou et al. |
| 2013/0075845 A1 | 3/2013 | Chen et al. |
| 2013/0119495 A1 | 5/2013 | Vetro et al. |
| 2013/0157385 A1 | 6/2013 | Jung et al. |
| 2013/0181305 A1 | 7/2013 | Nakayama et al. |
| 2013/0244344 A1 | 9/2013 | Malmhall et al. |
| 2013/0267042 A1 | 10/2013 | Satoh et al. |
| 2013/0270523 A1 | 10/2013 | Wang et al. |
| 2013/0270661 A1 | 10/2013 | Yi et al. |
| 2013/0307097 A1 | 11/2013 | Yi et al. |
| 2013/0341801 A1 | 12/2013 | Satoh et al. |
| 2014/0009994 A1 | 1/2014 | Parkin et al. |
| 2014/0036573 A1 | 2/2014 | Ishihara et al. |
| 2014/0042571 A1 | 2/2014 | Gan et al. |
| 2014/0048896 A1 | 2/2014 | Huang et al. |
| 2014/0070341 A1 | 3/2014 | Beach et al. |
| 2014/0087483 A1* | 3/2014 | Ohsawa .............. H01J 37/3053 438/3 |
| 2014/0093701 A1 | 4/2014 | Sahoo et al. |
| 2014/0103472 A1 | 4/2014 | Kent et al. |
| 2014/0103473 A1 | 4/2014 | Kent et al. |
| 2014/0131824 A1 | 5/2014 | Kitagawa et al. |
| 2014/0159175 A1 | 6/2014 | Lee et al. |
| 2014/0169085 A1 | 6/2014 | Wang et al. |
| 2014/0177316 A1 | 6/2014 | Otsuka et al. |
| 2014/0217531 A1 | 8/2014 | Jan |
| 2014/0252439 A1 | 9/2014 | Guo |
| 2014/0264671 A1 | 9/2014 | Chepulskyy et al. |
| 2015/0008550 A1 | 1/2015 | Min et al. |
| 2015/0056368 A1 | 2/2015 | Wang et al. |
| 2015/0171315 A1 | 6/2015 | Gan et al. |
| 2015/0171316 A1 | 6/2015 | Park et al. |
| 2015/0279904 A1 | 10/2015 | Pinarbasi |
| 2015/0357015 A1 | 12/2015 | Kent et al. |
| 2015/0372687 A1 | 12/2015 | Buhrman et al. |
| 2016/0027999 A1* | 1/2016 | Pinarbasi ............ H01L 43/12 438/3 |
| 2016/0087193 A1 | 3/2016 | Pinarbasi et al. |
| 2016/0093798 A1 | 3/2016 | Kim et al. |
| 2016/0099405 A1 | 4/2016 | Zimmer et al. |
| 2016/0111634 A1 | 4/2016 | Lee et al. |
| 2016/0126452 A1 | 5/2016 | Kuo et al. |
| 2016/0126453 A1 | 5/2016 | Chen et al. |

(56) References Cited

U.S. PATENT DOCUMENTS

| | | |
|---|---|---|
| 2016/0163965 A1 | 6/2016 | Han et al. |
| 2016/0163973 A1 | 6/2016 | Pinarbasi |
| 2016/0181508 A1 | 6/2016 | Lee et al. |
| 2016/0218278 A1 | 7/2016 | Pinarbasi et al. |
| 2016/0276006 A1 | 9/2016 | Ralph et al. |
| 2016/0284762 A1 | 9/2016 | Wang et al. |
| 2016/0315118 A1 | 10/2016 | Kardasz et al. |
| 2016/0315259 A1 | 10/2016 | Kardasz et al. |
| 2016/0372656 A1 | 12/2016 | Pinarbasi et al. |
| 2017/0018705 A1 | 1/2017 | Harms et al. |
| 2017/0025472 A1 | 1/2017 | Kim et al. |
| 2017/0033156 A1 | 2/2017 | Gan et al. |
| 2017/0033283 A1 | 2/2017 | Pinarbasi et al. |
| 2017/0033742 A1 | 2/2017 | Akerman |
| 2017/0047107 A1 | 2/2017 | Berger et al. |
| 2017/0084826 A1 | 3/2017 | Zhou et al. |
| 2017/0222132 A1 | 8/2017 | Pinarbasi et al. |
| 2017/0236570 A1 | 8/2017 | Kent et al. |
| 2017/0324029 A1 | 11/2017 | Pinarbasi et al. |
| 2017/0331032 A1 | 11/2017 | Chen et al. |
| 2017/0331033 A1 | 11/2017 | Kardasz et al. |
| 2018/0047894 A1 | 2/2018 | Pinarbasi et al. |
| 2018/0076382 A1 | 3/2018 | Park et al. |
| 2018/0114898 A1 | 4/2018 | Lee |
| 2018/0205001 A1 | 7/2018 | Beach et al. |
| 2018/0248110 A1 | 8/2018 | Kardasz et al. |
| 2018/0248113 A1 | 8/2018 | Pinarbasi et al. |
| 2019/0304653 A1 | 10/2019 | Oguz et al. |

FOREIGN PATENT DOCUMENTS

| | | |
|---|---|---|
| CN | 102334207 A | 1/2012 |
| CN | 102823008 A | 12/2012 |
| CN | 102959693 A | 3/2013 |
| CN | 103299370 A | 9/2013 |
| CN | 103608861 A | 2/2014 |
| CN | 105706259 A | 6/2016 |
| CN | 105917480 A | 8/2016 |
| CN | 106062979 A | 10/2016 |
| CN | 107750382 A | 3/2018 |
| CN | 107851712 A | 3/2018 |
| EP | 1345277 A1 | 9/2003 |
| EP | 3298636 A1 | 3/2018 |
| FR | 2817998 A1 | 6/2002 |
| FR | 2832542 A1 | 5/2003 |
| FR | 2910716 A1 | 6/2008 |
| JP | H10-004012 A | 1/1998 |
| JP | H11-120758 A | 4/1999 |
| JP | H11-352867 A | 12/1999 |
| JP | 2001-195878 A | 7/2001 |
| JP | 2002-261352 A | 9/2002 |
| JP | 2002-357489 A | 12/2002 |
| JP | 2003-318461 A | 11/2003 |
| JP | 2005-044848 | 2/2005 |
| JP | 2005-150482 A | 6/2005 |
| JP | 2005-535111 A | 11/2005 |
| JP | 4066477 B2 | 3/2006 |
| JP | 2006-128579 A | 5/2006 |
| JP | 2008-38362 | 2/2008 |
| JP | 2008-098365 | 4/2008 |
| JP | 2008-524830 A | 7/2008 |
| JP | 2008-192832 | 8/2008 |
| JP | 2009-027177 A | 2/2009 |
| JP | 2009-231753 | 10/2009 |
| JP | 2012-004222 | 1/2012 |
| JP | 2013-012546 A | 1/2013 |
| JP | 2013-048210 | 3/2013 |
| JP | 2013-219010 A | 10/2013 |
| JP | 2014-022751 | 2/2014 |
| JP | 2014-039061 A | 2/2014 |
| JP | 2014-517516 | 7/2014 |
| JP | 5635666 B2 | 12/2014 |
| JP | 2015-002352 A | 1/2015 |
| JP | 2017-510989 A | 4/2017 |
| JP | 2017527097 A | 9/2017 |
| JP | 2017532752 A | 11/2017 |
| KR | 10-2014-0115246 A | 9/2014 |
| KR | 10-2015-0016162 A | 2/2015 |
| WO | 2009-080636 A1 | 7/2009 |
| WO | WO 2011-005484 A2 | 1/2011 |
| WO | WO 2013/027406 | 2/2013 |
| WO | WO 2014-062681 | 4/2014 |
| WO | WO-2015-153142 A1 | 10/2015 |
| WO | 2016011435 A1 | 1/2016 |
| WO | WO 2016-014326 A1 | 1/2016 |
| WO | WO 2016-048603 A1 | 3/2016 |
| WO | WO-2016-171800 A1 | 10/2016 |
| WO | WO-2016-171920 A1 | 10/2016 |
| WO | WO-2016-204835 A1 | 12/2016 |
| WO | WO-2017-019134 A1 | 2/2017 |
| WO | WO-2017-030647 A1 | 2/2017 |
| WO | WO-2017-131894 A1 | 8/2017 |
| WO | WO 2017/151735 A1 | 9/2017 |

OTHER PUBLICATIONS

US 7,026,672, 4/2006, Grandis, Inc. (withdrawn).
R.H. Koch, et al., "Thermally Assisted Magnetization Reversal in Submicron-Sized Magnetic Thin Films"; Physical Review Letters; The American Physical Society; vol. 84, No. 23; Jun. 5, 2000, pp. 5419-5422 (4 pages).
K.J. Lee, et al., "Analytical investigation of spin-transfer dynamics using a perpendicular-to-plane polarizer"; Applied Physics Letters; American Institute of Physics; vol. 86, (2005); pp. 022505-1 to 022505-3 (3 pages).
Kirsten Martens, et al., "Thermally Induced Magnetic Switching in Thin Ferromagnetic Annuli"; NSF grants PHY-0351964 (DLS); 2005; 11 pages.
Kirsten Martens, et al., "Magnetic Reversal in Nanoscopic Ferromagnetic Rings"; NSF grants PHY-0351964 (DLS); 2006; 23 pages.
"Magnetic Technology Sprintronics, Media and Interface"; Data Storage Institute, R&D Highlights; Sep. 2010; 3 pages.
Andrew Kent, et al.; U.S. Appl. No. 61/715,111, filed Oct. 17, 2012, entitled "Inverted Orthogonal Spin Transfer Layer Stack".
International Search Report and Written Opinion dated Jul. 10, 2015 in PCT/US2015/021580; 12 pages.
Pinarbasi, et al.; U.S. Appl. No. 14/814,036, filed Jul. 30, 2016, entitled "Precessional Spin Current Structure for MRAM".
Kardasz, et al.; U.S. Appl. No. 14/866,359, filed Sep. 25, 2015, entitled "Spin Transfer Torque Structure for MRAM Devices Having a Spin Current Injection Capping Layer".
International Search Report and Written Opinion dated Oct. 30, 2015 in PCT/US2015/040700; 11 pages.
International Search Report and Written Opinion dated Dec. 14, 2015 in PCT/US2015/047875; 13 pages.
Pinarbasi, et al.; U.S. Appl. No. 15/041,325, filed Feb. 11, 2016, entitled "Method for Manufacturing MTJ Memory Device".
Kardasz, et al.; U.S. Appl. No. 15/091,853, filed Apr. 6, 2016, entitled "High Annealing Temperature Perpendicular Magnetic Anisotropy Structure for Magnetic Random Access Memory".
Pinarbasi, et al.; U.S. Appl. No. 15/093,367, filed Apr. 7, 2016, entitled "Magnetic Tunnel Junction Structure for MRAM Device".
Pinarbasi, et al.; U.S. Appl. No. 15/097,576, filed Apr. 13, 2016, entitled "Polishing Stop Layer(s) for Processing Arrays of Semiconductor Elements".
Pinarbasi, et al.; U.S. Appl. No. 15/157,783, filed May 18, 2016, entitled "Memory Cell Having Magnetic Tunnel Junction and Thermal Stability Enhancement Layer".
Berger, et al.; U.S. Appl. No. 15/174,482, filed Jun. 6, 2016, entitled "Method and Apparatus for Bipolar Memory Write-Verify".
International Search Report and Written Opinion dated Jun. 17, 2016 in PCT/US2016/021324; 9 pages.
International Search Report and Written Opinion dated Jun. 17, 2016 in PCT/US2016/021691; 9 pages.
International Search Report and Written Opinion dated Jul. 15, 2016 in PCT/US2016/026473; 9 pages.
International Search Report and Written Opinion dated Jul. 21, 2016 in PCT/US2016/027445; 10 pages.

(56) References Cited

OTHER PUBLICATIONS

International Search Report and Written Opinion dated Sep. 26, 2016 in PCT/US2016/037843; 10 pages.
S. Ikeda, et al.; "A perpendicular-anisotropy CoFeB—MgO magnetic tunnel junction"; Nature Materials, vol. 9, Sep. 2010; pp. 721-724; 4 pages.
Pinarbasi, et al.; U.S. Appl. No. 15/445,260, filed Feb. 28, 2017, entitled "Precessional Spin Current Structure for MRAM".
Pinarbasi, et al.; U.S. Appl. No. 15/445,362, filed Feb. 28, 2017, entitled "Precessional Spin Current Structure for MRAM".
NonFinal Office Action dated Mar. 20, 2015 in U.S. Appl. No. 14/242,419; 18 pages.
NonFinal Office Action dated Dec. 9, 2017 in U.S. Appl. No. 14/866,359; 26 pages.
NonFinal Office Action dated Feb. 8, 2017 in U.S. Appl. No. 15/174,482; 10 pages.
International Search Report and Written Opinion dated Apr. 7, 2017 in PCT/US2016/067444; 13 pages.
Notice of Allowance dated Apr. 21, 2017 in U.S. Appl. No. 15/157,783; 36 pages.
Mourad El Baraji, et al.; U.S. Appl. No. 15/859,517, filed Dec. 30, 2017, entitled "Microwave Write-Assist in Series-Interconnected Orthogonal STT-MRAM Devices".
Pinarbasi, et a.; U.S. Appl. No. 14/341,185, filed Jul. 25, 2014, entitled "Method for Manufacturing MTJ Memory Device".
Pinarbasi, et al.; U.S. Appl. No. 14/492,943, filed Sep. 22, 2014, entitled "Magnetic Tunnel Junction Structure for MRAM Device".
Mourad El Baraji, et al.; U.S. Appl. No. 15/859,514, filed Dec. 30, 2017, entitled "Microwave Write-Assist in Orthogonal STT-MRAM".
Manfred Ernst Schabes, et al.; U.S. Appl. No. 15/859,374, filed Dec. 30, 2017, entitled "Switching and Stability Control for Perpendicular Magnetic Tunnel Junction Device".
Manfred Ernst Schabes, et al.; U.S. Appl. No. 15/859,379, filed Dec. 30, 2017, entitled "Perpendicular Magnetic Tunnel Junction Device with Offset Precessional Spin Current Layer".
Manfred Ernst Schabes, et al.; U.S. Appl. No. 15/859,381, filed Dec. 30, 2017, entitled "Perpendicular Magnetic Tunnel Junction Device with Precessional Spin Current Layer Having a Modulated Moment Density".
Notice of Allowance dated Oct. 16, 2017 in U.S. Appl. No. 14/814,036; 16 pages.
Mustafa Michael Pinarbasi, et al.; U.S. Appl. No. 15/794,871, filed Oct. 26, 2017, entitled "Precessional Spin Current Structure for MRAM".
Michail Tzoufras, et al.; U.S. Appl. No. 15/858,950, filed Dec. 29, 2017, entitled "AC Current Pre-Charge Write-Assist in Orthogonal STT-MRAM".
Marcin Jan Gajek, et al.; U.S. Appl. No. 15/858,988, filed Dec. 29, 2017, entitled "Self-Generating AC Current Assist in Orthogonal STT MRAM".
Eric Michael Ryan, et al.; U.S. Appl. No. 15/859,015, filed Dec. 29, 2017, entitled "Shared Oscillator (STNO) for MRAM Array Write-Assist in Orthogonal STT-MRAM".
Michail Tzoufras, et al.; U.S. Appl. No. 15/859,030, filed Dec. 29, 2017, entitled "AC Current Write-Assist in Orthogonal STT-MRAM".
Kadriye Deniz Bozdag, et al.; U.S. Appl. No. 15/859,047, filed Dec. 29, 2017, entitled "Three-Terminal MRAM with AC Write-Assist for Low Read Disturb".
Manfred Ernst Schabes, et al.; U.S. Appl. No. 15/862,788, filed Jan. 5, 2018, entitled "Perpendicular Magnetic Tunnel Junction Device with Skyrmionic Enhancement Layers for the Precessional Spin Current Magnetic Layer".
Manfred Ernst Schabes, et al.; U.S. Appl. No. 15/859,384, filed Dec. 30, 2017, entitled "Perpendicular Magnetic Tunnel Junction Device with Skyrmionic Assist Layers for Free Layer Switching".
International Search Report and Written Opinion dated May 10, 2018 in PCT/US2018/014645; 14 pages.
International Search Report and Written Opinion dated May 30, 2018 in PCT/US2018/014641; 13 pages.
NonFinal Office Action dated Jan. 15, 2019 in U.S. Appl. No. 15/862,788.
Extended European Search Report dated Jan. 30, 2019 in EU Application No. 16812075.6.
NonFinal Office Action dated Mar. 22, 2019 in U.S. Appl. No. 16/027,739.
Notice of Allowance dated Feb. 12, 2019 in U.S. Appl. No. 15/859,381.
Notice of Allowance dated Mar. 21, 2019 in U.S. Appl. No. 15/858,950.
Final Office Action dated Jun. 9, 2017 in U.S. Appl. No. 14/814,038; 19 pages.
Final Office Action dated Dec. 13, 2018 in U.S. Appl. No. 15/091,853.
Notice of Allowance dated Nov. 30, 2018 in U.S. Appl. No. 15/859,514.
Notice of Allowance dated Dec. 12, 2018 in U.S. Appl. No. 15/858,988.
Restriction Requirement in U.S. Appl. No. 16/123,663 dated Apr. 24, 2019.
Final Office Action dated Jul. 9, 2015 in U.S. Appl. No. 14/242,419; 19 pages.
Final Office Action dated Nov. 8, 2018 in U.S. Appl. No. 15/445,260.
Final Office Action dated Nov. 16, 2018 in U.S. Appl. No. 15/445,362.
Non-Final Office Action dated Nov. 23, 2018 in U.S. Appl. No. 15/859,384.
Non-Final Office Action dated Nov. 26, 2018 in U.S. Appl. No. 15/858,950.
Non-Final Office Action dated Mar. 20, 2015 U.S. Appl. No. 14/242,419; 18 pages.
Non-Final Office Action dated Sep. 11, 2015 in U.S. Appl. No. 14/492,943; 13 pages.
Non-Final Office Action dated Jan. 20, 2016 in U.S. Appl. No. 14/242,419; 17 pages.
Non-Final Office Action dated Dec. 9, 2016 in U.S. Appl. No. 14/866,359; 26 pages.
Non-Final Office Action dated Dec. 23, 2016 in U.S. Appl. No. 15/093,367; 13 pages.
Non-Final Office Action dated Jan. 25, 2017 in U.S. Appl. No. 15/097,576; 17 pages.
Non-Final Office Action dated Feb. 6, 2017 in U.S. Appl. No. 14/814,036; 22 pages.
Non-Final Office Action dated Jun. 29, 2018 in U.S. Appl. No. 15/859,381.
Non-final Office Action dated Jun. 26, 2018 in U.S. Appl. No. 15/859,384.
Non-Final Office Action dated Jun. 29, 2018 in U.S. Appl. No. 15/859,374.
Notice of Allowance dated Sep. 26, 2018 in U.S. Appl. No. 15/859,047; 10 pages.
Notice of Allowance dated Nov. 9, 2018 in U.S. Appl. No. 15/859,015.
Notice of Allowance dated Nov. 21, 2018 in U.S. Appl. No. 15/859,030.
Notice of Allowance dated Nov. 21, 2018 in U.S. Appl. No. 15/859,374.
Notice of Allowance dated Oct. 24, 2018 in U.S. Appl. No. 15/859,517.
Notice of Allowance dated Nov. 21, 2018 U.S. Appl. No. 15/859,030.
Office Action dated Aug. 30, 2018 in Chinese Patent Application No. 201580009984.2.
Office Action dated Oct. 9, 2018 in Japanese Patent Application No. 2016-526761.
NonFinal Office Action dated Sep. 4, 2019 in U.S. Appl. No. 15/445,260.
NonFinal Office Action dated Sep. 16, 2019 in U.S. Appl. No. 15/445,362.
Notice of Allowance dated Oct. 2, 2019 in U.S. Appl. No. 16/123,663.
Notice of Allowance dated Oct. 4, 2019 in U.S. Appl. No. 16/027,739.
Notice of Allowance dated Nov. 15, 2019 in U.S. Appl. No. 16/192,972.
Notice of Allowance dated Dec. 11, 2019 in U.S. Appl. No. 16/197,622.

(56) References Cited

OTHER PUBLICATIONS

NonFinal Office Action dated Jun. 25, 2019 in U.S. Appl. No. 16/197,622.
Notice of Allowance dated Jun. 26, 2019 in U.S. Appl. No. 15/091,853.
Office Action dated Jul. 23, 2019 in Japanese Patent Application No. 2016-529428 (with English translation).
Notice of Allowance dated Jan. 17, 2020 in U.S. Appl. No. 15/445,362.
Notice of Allowance dated Jan. 28, 2020 in U.S. Appl. No. 15/445,260.
Office Action dated Jan. 21, 2020 in Japanese Patent Application No. 2016-529428 (with English translation).
Office Action dated Mar. 10, 2020 in Japanese Patent Application No. 2017-564822 (with English translation).

* cited by examiner

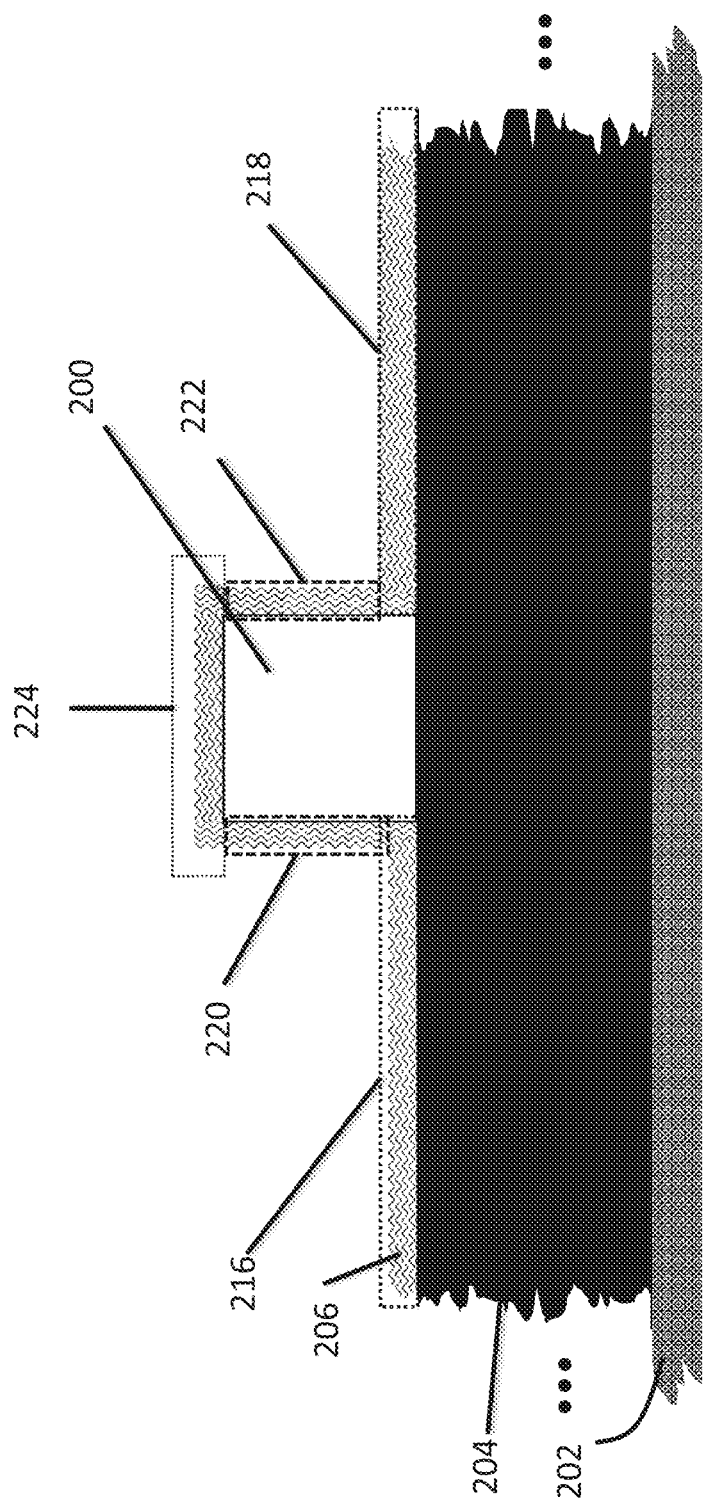

POLISHING STOP LAYER(S) FOR PROCESSING ARRAYS OF SEMICONDUCTOR ELEMENTS

CROSS-REFERENCE TO RELATED APPLICATION

This application is a divisional of U.S. patent application Ser. No. 15/097,576, filed Apr. 13, 2016, now U.S. Pat. No. 9,773,974. This application also claims the benefit of Provisional Application No. 62/198,870, filed Jul. 30, 2015. Priority to this provisional application is expressly claimed, and the disclosure of the provisional application is hereby incorporated herein by reference in its entirety.

FIELD

This disclosure relates generally to the field of semiconductor manufacturing, and, more particularly, to the formation and/or exposure of semiconductor elements on wafers using chemical-mechanical polishing.

BACKGROUND

The methods described in the embodiments may be used for the formation, isolation, and exposure of semiconductor elements on microchip wafers. In particular, the methods may be used for the isolation and exposure of magnetic tunnel junction (MTJ) pillar arrays.

An MTJ is a semiconductor device that may be comprised of two ferromagnets separated by an insulator. In the context of a magnetoresistive random access memory (MRAM) device, an MTJ may comprise a free magnetic layer and a reference magnetic layer, each of which are separated by the insulator. Additional layers are used to create a memory cell such an MRAM device. An MTJ for an MRAM device may also include a hard-mask above the magnetic layers.

MRAM is able to store information because the resistance of the MTJ pillar changes based the direction of the magnetization of the free layer. When the device writes information, the direction of magnetization can be switched to change the resistance of the MTJ pillar. The resulting resistance of the MTJ pillar is interpreted as a digital "1" or "0".

An example of a process for isolating, and then subsequently exposing MTJ pillars includes depositing a thick insulating layer to create bumps on the pillars and in valleys in the adjacent areas and then applying chemical mechanical polishing ("CMP") and/or reactive-ion-etching ("RIE") to remove the insulating layer until the top of the pillars are exposed.

However, this process has several drawbacks. As the CMP process progresses through the insulating layer, which can be very thick (hundreds of nanometers), determining when to stop the CMP process is very difficult. If the CMP process progresses too far, it can damage the pillars. In addition, the lack of CMP uniformity across the wafers can be significant, which negatively impacts the pillar height and size control.

FIG. 1A shows an example of a wafer array 100 containing MTJ pillars at locations 102, 104, and 106. If CMP is applied across the wafer, there will be significant deviation across the wafer in the height of the pillars. FIG. 1B, shows an example of a test wafer with the cross-section heights of MTJ pillars located at 102, 104 and 106. Specifically, in one test wafer, the height of the center pillar at 102 was 51 nanometers, the middle pillar at 104 was 39 nanometers, while the edge pillar at 106 was only 17 nanometers. The non-uniform polishing creates resistance uniformity issues between pillars and can cause damage to the pillars if the CMP removal is extreme. Such pillar damage includes micro-delamination, microcracks, and the creation of shunts.

These drawbacks cause wide-ranging problems with the MRAM incorporating the MTJ pillars. Damage and non-uniformity result in problematic tunnel magnetorestistance ("TMR") values, poor property control, and shunts. The inability to precisely stop the CMP process at the appropriate time prevents the use of the short pillars required for higher density arrays for MRAM. Alternative etching processes do not provide better control or across wafer uniformity.

Thus, there is a need in the art for a manufacturing process that is capable of insulating and subsequently exposing semiconductor elements that is consistent across a wafer, provides consistently high TMR values for large readout signals, allows for higher area density, has little risk of damaging or creating problems in the pillars, and can be performed easily at low cost.

SUMMARY

A method manufacturing a semiconductor device described. In an embodiment, the method comprises fabricating a plurality of MTJ pillars on a wafer, each of the plurality of MTJ pillars having a top surface and a side surface, the top surface extending at an MTJ pillar height from the wafer. The embodiment also comprises depositing a first layer on the semiconductor wafer, where the first layer is comprised of a high chemical-mechanical polish (CMP) rate material. This results in the first layer covering the top surface and side surface of each of the plurality of MTJ pillars. The first layer forms a first layer bump portion over the top surface of each of the plurality of MTJ pillars, a first layer side surface portion over the side surface of each of the plurality of MTJ pillars, and a plurality of first layer valley portions in between the plurality of MTJ pillars. The embodiment also comprises depositing a second layer over the first layer, the second layer being comprised of a low CMP rate material. This results in a second layer bump portion covering the first layer bump portion, a second layer side portion covering the first layer side portion, and a plurality of second layer valley portions covering the plurality of first layer valley portions, thereby forming a plurality of MTJ pillar bumps. Each of the plurality of MTJ pillar bumps correspond to the top surface of each of the plurality of MTJ pillars. The second layer having a thickness selected such that a top surface of the plurality of second layer valley portions are at a CMP stop height. The embodiment further comprises chemical-mechanical polishing the plurality of MTJ pillar bumps with a chemical-mechanical polisher. The embodiment further comprises detecting that the chemical-mechanical polisher has reached the top surface of second layer valley portion, and stopping the chemical-mechanical polishing step when the polisher has reached the top surface of the plurality of second layer valley portions such that the side surface of each of the plurality of MTJ pillars remains covered by the first layer and the second layer.

In an embodiment, during the depositing of the second layer step, the second layer is deposited such that the top surface of the plurality of second layer valley portions are above the MTJ pillar height. In an embodiment, after stopping the chemical-mechanical polishing step, the method further comprises etching using an IBE process to remove any remaining portion of the plurality of MTJ pillar bumps over the top surface of the MTJ.

In an embodiment, during the depositing of the second layer step, the second layer is deposited such that the top surface of the second layer valley portion is at the MTJ pillar height, thereby allowing exposure of top surfaces of the plurality of MTJ pillars.

In an embodiment, each of the plurality of MTJ pillars includes a reference layer and a free layer separated by a tunneling layer, and a hard mask over the free layer. During the depositing of the second layer step, the second layer is deposited such that the top surface of second layer valley portion is above a bottom surface of the hard-mask layer of the MTJ pillar.

In an embodiment, a third layer is deposited over the second layer. The third layer is comprised of high CMP rate material, such that a third layer bump portion covers each second layer bump portion, a third layer side portion covers each second layer side portion, and a plurality of third layer valley portions cover the plurality of second layer valley portions. In this embodiment, this forms the plurality of MTJ pillar bumps with additional height imparted by the third layer bump portion. Each of the plurality of MTJ pillar bumps correspond to the top surface of each of the plurality of MTJ pillars. Each of the plurality of MTJ pillar bumps comprising a third layer bump portion, a second layer bump portion and a first layer bump portion.

In an embodiment, the first layer is an insulator material. In another embodiment, the insulator material is SiOx.

In an embodiment, the second layer is an insulator material. In another embodiment, the insulator material is SiNx.

In an embodiment, during the depositing of the second layer step, the second layer is deposited such that the top surface of the plurality of second layer valley portions is above the MTJ pillar height.

In an embodiment, after stopping the chemical-mechanical polishing step, the method further comprises etching using an IBE process to remove any remaining portion of the plurality of MTJ pillar bumps over the top surface of the MTJ.

In an embodiment, the method further comprises depositing an electrode layer prior to the fabricating a plurality of magnetic tunnel junction (MTJ) pillars on a wafer step.

In another embodiment, a semiconductor device is disclosed, which comprises a semiconductor wafer. The device also comprises a plurality of MTJ pillars thereon, where each MTJ pillar comprises a plurality of layers and a hard-mask layer. The hard-mask layer has a bottom surface at a hard-mask bottom height. Each MTJ pillar has a top surface and a side surface. The top surface extends at an MTJ pillar height from the wafer. The top surface of each MTJ pillar is exposed for electrical connection. The device further comprises a semiconductor wafer with the plurality of MTJ pillars thereon having a plurality of valley portions between the plurality of MTJ pillars. The device further can have a first layer. The first layer is comprised of a high chemical-mechanical polish (CMP) rate material. The first layer comprising a side portion over the side surface of each of the plurality of MTJ pillars and a plurality of valley portions over the plurality of valley portions of the semiconductor wafer. The device can also comprise a second layer, where the second layer comprises a low chemical-mechanical polish (CMP) rate material. The second layer comprises a side portion over each side portion of the first layer and plurality of valley portions over the plurality of valley portions of the first layer. Each valley portion of the second layer has a top surface. The second layer has a thickness such that the top surface of a valley portion of the second layer has a height above the hard-mask bottom height.

In an embodiment, the second layer of the device has a thickness such that the top surface of a valley portion of the second layer has a height equal to the MTJ pillar height, thereby exposing top surfaces of the plurality of MTJ pillars.

In another embodiment, the second layer of the device has a thickness such that the top surface of a valley portion of the second layer has a height above the MTJ pillar height.

In an embodiment, the first layer of the device is an insulator material. In an embodiment, the insulator material is SiOx.

In embodiment, the second layer is an insulator material. In embodiment, the insulator material is SiNx.

In an embodiment, the device comprises a third layer. The third layer is comprised of a high CMP rate material, and comprises a side portion over each side portion of the second layer and plurality of valley portions over the plurality of valley portions of the second layer.

In another embodiment, a method for manufacturing a semiconductor device is disclosed. The method comprises fabricating plurality of MTJ pillars on a surface. The surface is on a semiconductor wafer. Each of the plurality of MTJ pillars has a top surface and a side surface, where the top surface extends at an MTJ pillar height from the surface. This embodiment of the method further comprises depositing a first layer. The first layer comprises a high chemical-mechanical polish (CMP) rate material, and covers the top surface of each of the plurality of MTJ pillars, the side surface of each of the plurality of MTJ pillars, and the surface. This embodiment of the method further comprises depositing a low chemical-mechanical polish (CMP) rate layer over the first layer, thereby forming a plurality of MTJ pillar bumps. Each of the plurality of MTJ pillar bumps corresponds to the top surface of each of the plurality of MTJ pillars. The low CMP rate layer further forms a low CMP rate layer valley surface between the plurality of MTJ pillar bumps. Each of the plurality of MTJ pillar bumps comprises portions of the first high CMP rate layer and the low CMP rate layer extending over the top surface of each of the plurality of MTJ pillars. The low CMP rate layer has a thickness selected such that the low CMP rate layer valley surface is at the MTJ pillar height. This embodiment of the method further comprises chemical-mechanical polishing of the semiconductor with a polishing pad to remove the plurality of MTJ pillar bumps. This embodiment of the method further comprises detecting that the polishing pad has reached the low CMP rate layer valley surface. This embodiment further comprises stopping the chemical-mechanical polishing step such that the top surface of each of the MTJ pillars is exposed while the side surface of each of the plurality of MTJ pillars remains covered by high CMP rate layer and the low CMP rate layer.

In an embodiment, the first layer is an insulator material. In another embodiment, the insulator material is SiOx.

In an embodiment, the low CMP rate layer is an insulator material. In another embodiment, the insulator material is SiNx.

These and other objects, features, aspects, and advantages of the embodiments will become better understood with reference to the following description and accompanying drawings.

BRIEF DESCRIPTION OF THE DRAWINGS

The accompanying drawings, which are included as part of the present specification, illustrate the presently preferred embodiments and, together with the general description given above and the detailed description given below, serve to explain and teach the principles of the MTJ devices described herein.

FIG. 2A shows a cross section of an MTJ pillar with a first isolating layer and the top, side and valley regions of the first isolating layer.

Figure 1A:
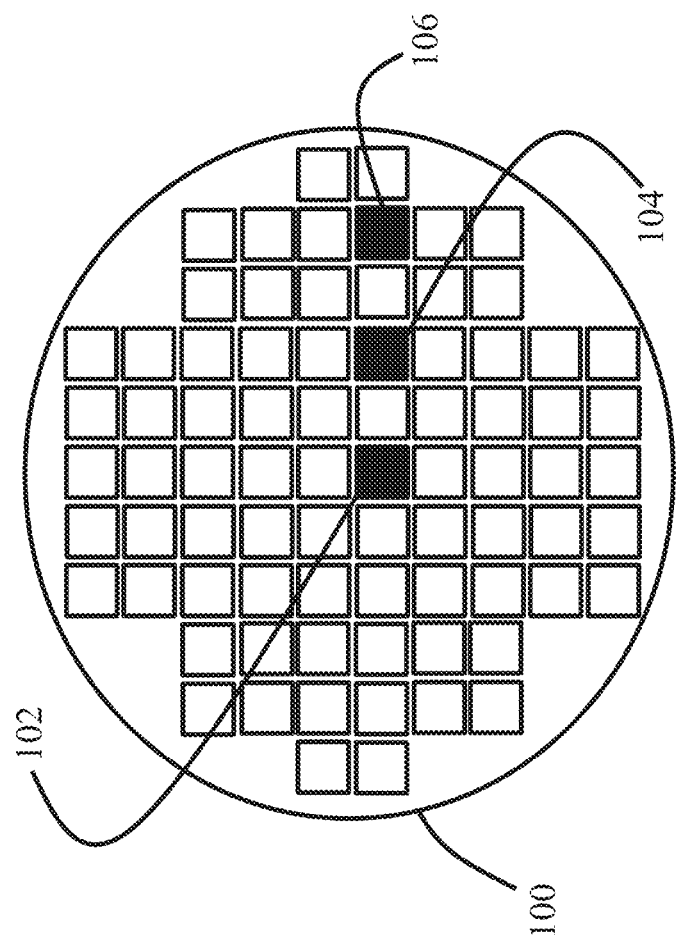
FIG. 1A shows a view from the top of an MRAM wafer.

The figures are not necessarily drawn to scale and the elements of similar structures or functions are generally represented by like reference numerals for illustrative purposes throughout the figures. The figures are only intended to facilitate the description of the various embodiments described herein; the figures do not describe every aspect of the teachings disclosed herein and do not limit the scope of the claims.

DETAILED DESCRIPTION

A method for manufacturing semiconductor devices that can be used when fabricating MRAM devices utilizing MTJs is disclosed herein. Each of the features and teachings disclosed herein can be utilized separately or in conjunction with other features and teachings. Representative examples utilizing many of these additional features and teachings, both separately and in combination, are described in further detail with reference to the attached drawings. This detailed description is merely intended to teach a person of skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly representative examples of the present teachings.

In the following description, for purposes of explanation only, specific nomenclature is set forth to provide a thorough understanding of the MTJ memory device and the method for manufacturing the same as described herein. The various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity for the purpose of original disclosure, as well as for the purpose of restricting the claimed subject matter. It is also expressly noted that the dimensions and the shapes of the components shown in the figures are designed to help to understand how the present teachings are practiced, but not intended to limit the dimensions and the shapes shown in the examples.

Embodiments of this patent include all applications in electronics manufacturing for slowing the chemical mechanical polish process using a stop layer. The detailed description, however, focuses on an embodiment applying this processing scheme to make improved MRAM arrays of MTJs for nonvolatile storage applications. This detailed description is provided to explain the process and is not intended to limit the scope of the claims.

The embodiments use materials with both high and low chemical mechanical polishing (CMP) etch rates where the height of the low CMP etch rate material (LR-CMP material) in the valley adjacent to the MTJ pillar defines the CMP stop-height.

The embodiments also include CMP with an ion beam etching (IBE) step to expose the top of the MTJ pillar. CMP removes the material more quickly and if not done properly may create mechanical stress on the pillars, whereas IBE can be used in the final stages to remove the remaining material more gently to expose the top of the pillars. Using the IBE process following the precisely controlled CMP step eliminates any mechanical stress associated with the CMP process that can affect the interfaces or even induce microdelamination of the MTJ layers once CMP pads make contact to MTJ stack. The IBE process may also be used with its own stop layer that once exposed provides a clear signal to cease the IBE process.

In one embodiment, both a high CMP polish rate material (HR-CMP material) and a low CMP polish rate material (LR-CMP material) are deposited on an MTJ. The high CMP polish rate material may be SiOx (e.g., silicon dioxide) and the low CMP polish rate material may be SiNx (silicon nitride). Note that there does not have to be a particular polish rate associated with either a HR-CMP material or LR-CMP material. Rather, it is the relative polish rate of the LR-CMP (e.g., two nanometers per minute) material compared to the HR-CMP (e.g., seventy nanometers per minute) material that define a LR-CMP material and HR-CMP material. While the disclosure below focuses on the CMP process, it should be understood that CMP process can be followed by reactive ion etching (RIE) and IBE.

The height of the LR-CMP material in the valley adjacent to the bump over the MTJ pillar is adjustable and allows a manufacturer to determine the point at which CMP may be terminated. When the CMP process moves from the HR-CMP material to the LR-CMP material, the speed of the removal slows significantly and hence this feedback allows the CMP end point can be determined accurately.

The height of the LR-CMP material may be very precisely determined because deposition techniques including physical vapor deposition (PVD), sputtering, and plasma-enhanced chemical vapor deposition (PECVD) allow very exact control of the thickness of the layers. Thus, the CMP process can be stopped at a precisely predetermined height.

Figure 2B:
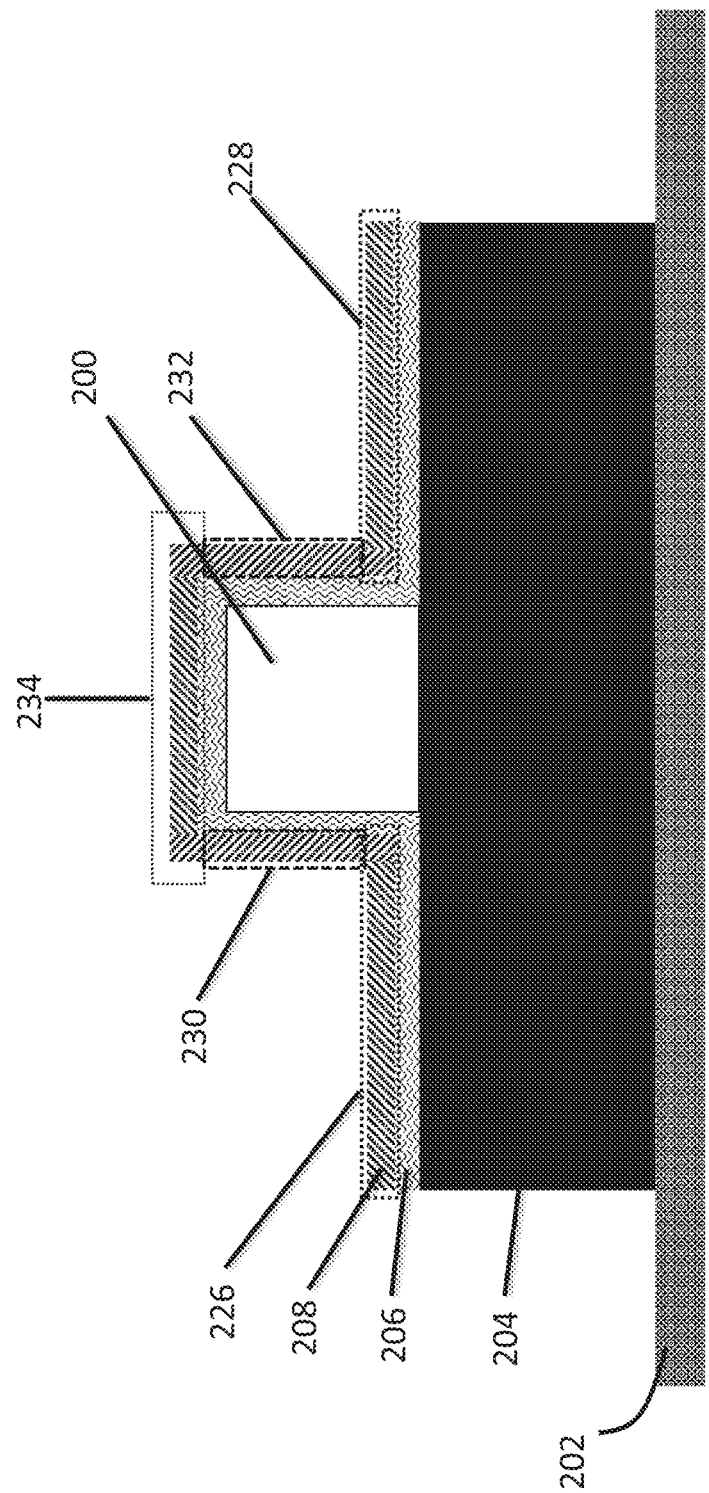
FIG. 2B shows a cross section of an MTJ pillar under a first and a second isolating layer.

In an embodiment of the methods described herein, the MTJ pillars are fabricated on a wafer and isolated, as will be discussed initially with reference to FIGS. 2A-2C. An MTJ can include a reference layer and a free layer, separated by a tunneling layer (an insulator), not shown in FIG. 2A. Other layers may be present as well (e.g., a polarizing layer, various capping layers, etc.). The fabrication and isolation of this embodiment is shown in a cross section of a single MTJ pillar in FIG. 2A. In FIG. 2A, an MTJ pillar 200 is fabricated on an electrode, 204, which sits on a wafer 202. Electrode 204 will be deposited over most or all of wafer 202. Note, however, that FIG. 2A only shows a single MTJ pillar 200 on a portion of electrode 204, but it should be understood that electrode 204 extends further than shown. It should be understood that a wafer used to manufacture an MRAM device can have thousands or millions of such MTJ pillars.

After fabricating MTJ pillar 200, MTJ pillar 200 is isolated. In the embodiment of FIG. 2A, a first isolating layer of SiOx or SiNx, 206 may be sputtered onto the MTJ pillar 200 and electrode 204. The surface of the layers in FIG. 2A are comprised of several regions. The bump region 224 is situated generally horizontally over the MTJ pillar and contacts the top surface of the MTJ 200. The side regions 220 and 222 are associated with the sides of MTJ pillar and contact the side surfaces of the MTJ pillar. The valley regions 216 and 218 are generally horizontal and extend above the electrode 204 and they include areas between the MTJ pillars 200. While the figures and description show these regions as entirely horizontal or vertical, they often have curvature and angle that deviate from the horizontal and vertical. This is true of all such layers discussed in the specification or claims.

An embodiment of the process described herein may use a plasma-enhanced chemical vapor deposition (PECVD) process to deposit second isolating layer of SiOx 208 over the first isolating layer 206, the result of which is shown in FIG. 2B. The second isolating layer 208 also has a bump region 234, which is associated with the top of the MTJ pillar and contacts the bump region of layer 206. The second isolating layer has two side regions 230 and 232 that are associated with the sides of the MTJ pillars and contact the side regions of layer 206. The second isolating layer also has two valley regions 226 and 228 that sit on top of the valley regions of the first isolating layer 206. After the second isolating layer of SiOx 208 is deposited, back electrode isolation is performed. This step isolates the MTJ stack layers by removing portions of electrode 204 in between MTJ pillars 200. Thus, for example, FIG. 2A shows electrode 204 and first isolating layer 206 extending across the wafer. After back electrode isolation, each MTJ pillar 200 will be associated with a single electrode 204, as seen in FIG. 2B.

As will now be discussed with reference to FIG. 2C, an embodiment of the process described herein deposits a third isolating layer and a fourth CMP stop layer after back electrode isolation. Specifically, just as in FIG. 2B, the embodiment of FIG. 2C fabricates MTJ pillar 200 onto an electrode 204, which itself has been fabricated on wafer 202. The embodiment uses a sputtering process to deposit a first isolating SiOx layer 206 over MTJ pillar 200 and electrode 204. Then the embodiment uses a PECVD process to deposit a second isolating SiOx layer 208 over the first isolating SiOx layer 206. While not shown separately in FIG. 2C, these layers still have bump regions (224 and 234), side regions (220, 222, 230, and 232), and valley regions (216, 218, 226, and 228) as were shown in FIGS. 2A and 2B.

After the back electrode isolation process is completed, a PECVD process is used to deposit a third isolating layer of SiOx 210 to encapsulate the MTJ pillar 200 (and adjacent regions), as shown. This layer also includes a bump region, side regions, and valley regions (not outlined). Thereafter, a PVD or PECVD process is used to deposit a fourth CMP stop layer 212. Like the first, second, and third isolating layers, the fourth CMP stop layer includes a bump region 236 situated generally horizontally above the MTJ pillar and deposited over the top region of layer 210, side regions 248 and 240 associated with the sides of the MTJ pillar and deposited over the side regions of layer 210, and valley regions 242 and 244 deposited over the valley regions of layer 210. The bump regions are a small fraction of the total wafer surface area and CMP rate is largely defined by the valley regions on the wafer.

The fourth LR-CMP stop layer 212 may be made of SiNx, which is a LR-CMP insulator material. Because the fourth CMP stop layer 212 is a LR-CMP material, as the CMP polishing pad proceeds through the bump and side regions of the various layers, it encounters the valley portion of the LR-CMP stop layer (242 and 244), which slows the CMP process and thus allows the CMP process to be easily stopped. While the CMP process will encounter both LR-CMP and HR-CMP material in the bump and side portions, it will still be significantly slowed when it reaches the larger valley portions of the fourth LR-CMP stop layer (242 and 244).

Note that the surface of a wafer having MTJ pillars 200 formed thereon will have "bumps" formed across the wafer, with each bump corresponding to MTJ pillars 200. These bumps may include the bump portions of the many layers, but may also include portions of the side and valley regions of certain layers.

The top of MTJ pillars 200 must be exposed so that further processing steps can be performed to connect MTJ pillars to other contacts. In other words, each MTJ pillar 200 must be exposed so that electrical connections can be made to such MTJ pillars 200. A CMP process may be used to polish the wafer surface (comprising deposited layers), thereby removing the bumps exposing the top of each MTJ pillar 200 formed on the wafer. Alternatively, the CMP process may be stopped above the pillar. It shall be understood that an MTJ pillar is considered exposed when electrical connections can be made to the top of the pillars.

The ratio of the thickness of the third insulating layer 210 of SiOx to the fourth CMP stop layer 212 of SiNx can be adjusted or it can all be SiNx, so long as there is a sufficiently thick SiNx (or other suitable low CMP polish rate material) to act as the fourth CMP stop layer after the CMP process encounters the valley portions of the fourth CMP stop layer (242 and 244). A person having ordinary skill in the art will recognize that any appropriate manner of deposition of the layers may be used and the order of the deposition, the particular layers required, and the materials used, may be varied. A person of skill will further recognize that three isolating layers prior to the deposition of the fourth LR-CMP stop layer are not required.

Figure 2C:
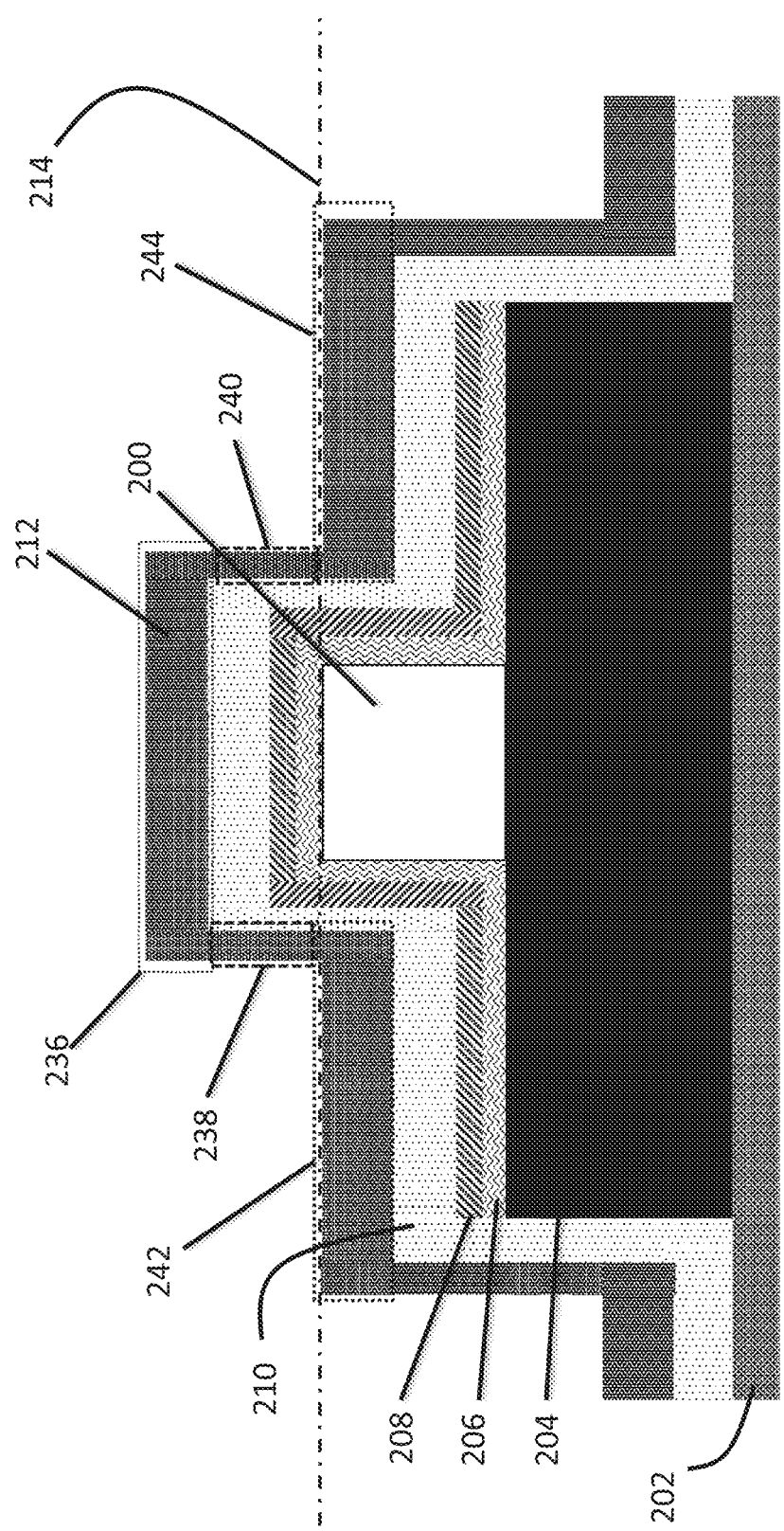
FIG. 2C shows a cross section of an embodiment with three isolating layers and a low rate CMP stop-layer.
Figure 3A:
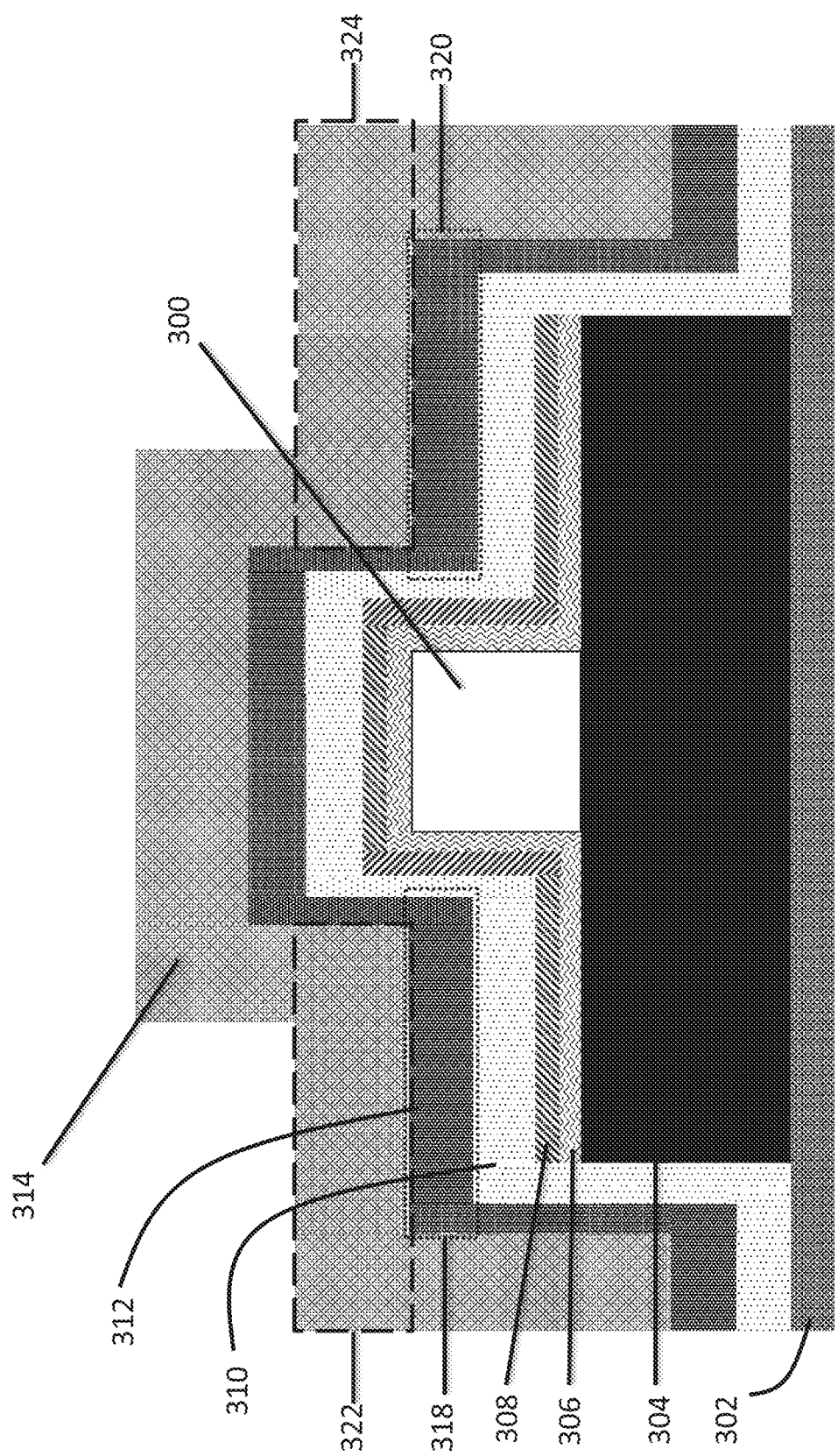
FIG. 3A shows a cross section of an embodiment with an MTJ pillar under several layers of insulators including a low CMP polish rate stop-layer and an addition of a final high CMP polish rate insulator.

In certain embodiments, the fourth LR-CMP stop layer 212 of FIG. 2C can be covered by one or more insulating layers. This is illustrated in the embodiment of FIG. 3A. The embodiment fabricates the MTJ pillar 300 on an electrode 304, which is fabricated on a wafer 302. The embodiment may sputter a first isolating layer 306 of SiOx onto MTJ 300. Thereafter, the embodiment may use PECVD to deposit a second isolating layer 308 of SiOx over the first isolating layer 306. Then, the embodiment may use PECVD to deposit a third insulating layer 310 of SiOx over the second isolating layer 308. Next, PVD may be used to deposit a fourth LR-CMP stop layer 312 of SiNx (a LR-CMP material) on top of the third isolating layer 310, which is made of SiOx. Thereafter the embodiment may use a PECVD process to deposit a fifth HR-CMP insulating layer 314 of SiOx over the fourth LR-CMP stop layer 312. FIG. 3A shows one fifth HR-CMP insulating layer 314 of SiOx deposited on top of the fourth LR-CMP stop layer 312 of SiNx, although it should be noted that additional layers can also be used. The first three isolating layers all include bump regions, side regions and valley regions as has been discussed (note that these regions are not labeled in FIG. 3A but are present). The fourth LR-CMP stop layer has a bump region (not labeled), two side regions (not labeled), and two valley regions 318 and 320 shown with a dotted line. The fifth HR-CMP insulating layer 314 also has a bump region (not labeled), two side regions (not labeled), and two valley regions 322 and 324.

As will now be discussed, fourth LR-CMP stop layer 312 and fifth HR-CMP insulating layer 314 make it possible to stop the CMP process when the CMP polishing pad encounters the valley regions of the CMP stop layer 318 and 320. This exposes the top of the MTJ pillar 300 so that a contact can be added but also allows the MTJ pillars 300 on the wafer to have consistent height across the wafer.

Figure 3B:
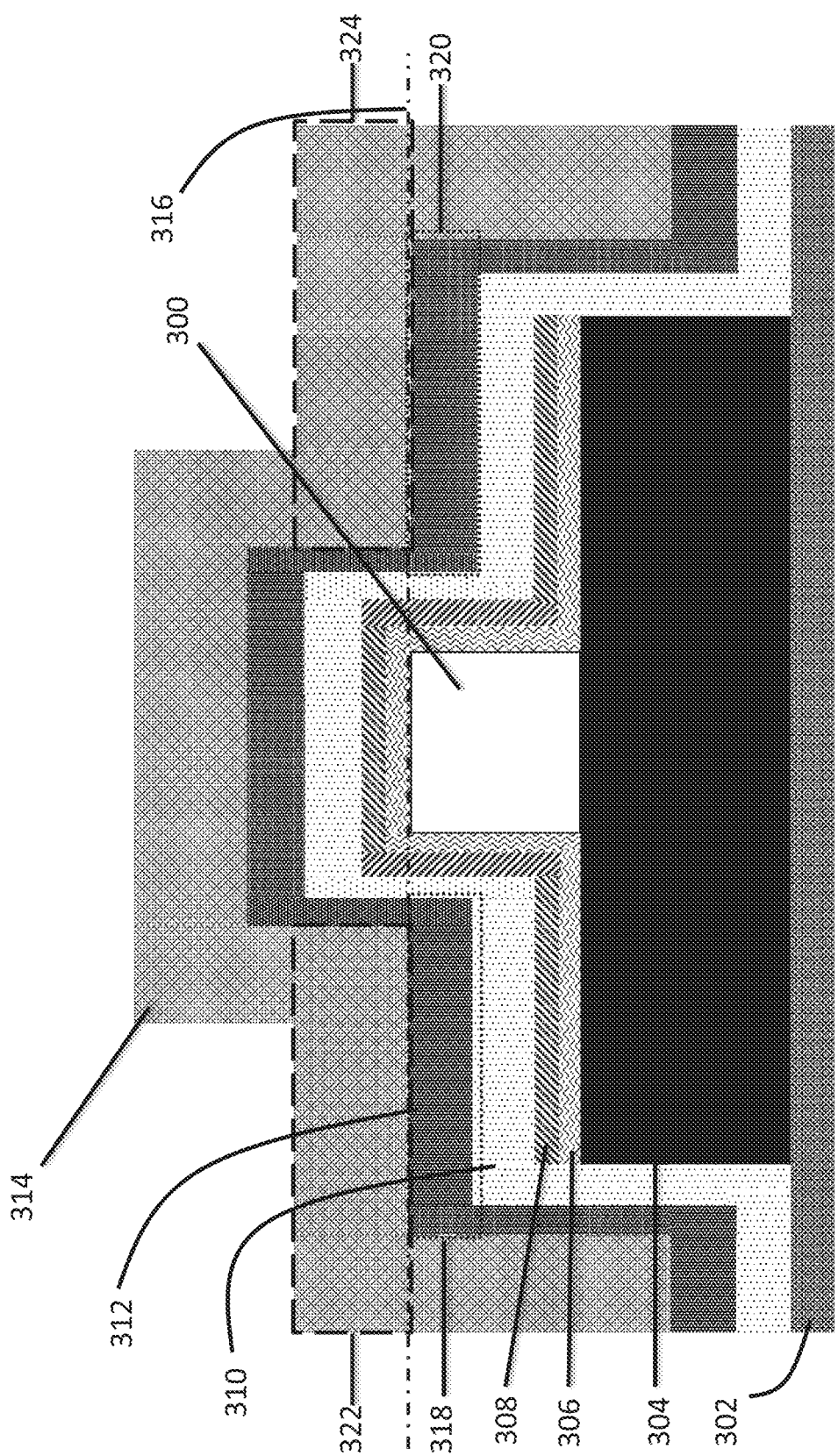
FIG. 3B shows a cross section of an embodiment with an MTJ pillar under several layers of insulators including a low CMP polish rate stop-layer and an addition of a final high CMP polish rate insulator and the CMP stop height.

As shown in FIG. 3B, after all layers have been deposited, the CMP process can polish through the bumps formed by the several layers over the MTJ pillars 300. While polishing the bumps include polishing the bump regions of layers 314, 312, 310, 308, and 306 and portions of the side regions of layers 314, 312, 310, and 308, the operative transition occurs between the valley regions. When the CMP process completely removes the valley regions of the fifth HR-CMP layer 322 and 324, it encounters the valley regions of the LR-CMP stop layer, 318 and 320. When the CMP polishing pad encounters these LR-CMP valley regions, CMP slows substantially, and the CMP process can be stopped at the CMP stop-height 316. In this embodiment, the fifth HR-CMP layer 314 is made of SiOx, which for selective slurries polishes at approximately five times the rate of the LR-CMP layer 312, which is made of SiNx. Thus, once the CMP polishing pad reaches the valley regions 318 and 320 of the LR-CMP layer 312, the polish rate drops significantly. The reduced polish rate indicates that CMP can be stopped.

In the embodiment in FIG. 3B, the CMP process slows significantly at the CMP-stop height 316. For the embodiment in FIG. 2C, the valley portions of LR-CMP stop layer 242 and 244, significantly slows the CMP process at the CMP-stop height 214. CMP can then be ceased.

The height of fifth CMP stop layers 214 and 314 can be varied through the deposition process and may be set to stop the CMP process above, or below the top of the MTJ pillar. If very gentle exposure is not needed, the CMP stop-height may be set below MTJ pillar height. Such may be appropriate when there is hard-mask at the top of the MTJ pillar 300 is thick enough to avoid damage to the pillars.

If a gentle pillar exposure is needed and one cannot afford to stress the MTJ stack (200, 300) with CMP, then the thickness/height of the fourth LR-CMP stop layers (212 and 312) can be deposited so that their valley portions (318, 320, 242, 244) are higher than MTJ pillar height. Once CMP is completed, the additional removal can be done using IBE or RIE.

Figure 4A:
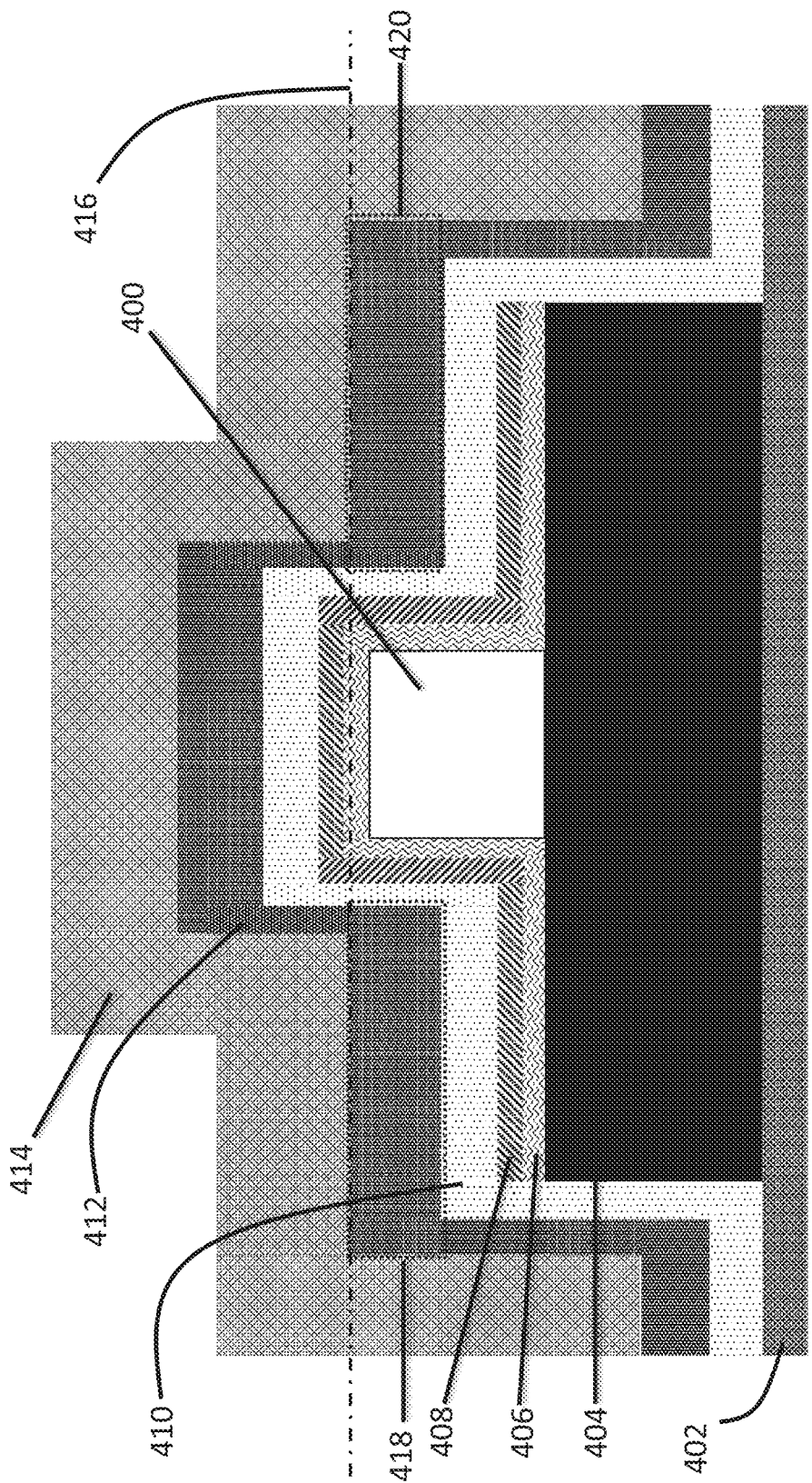
FIG. 4A shows a cross section of an embodiment with an MTJ pillar under three isolating layers a fourth low rate CMP stop-layer, and a fifth high rate CMP layer at a time prior to when CMP polishing has been performed.
Figure 4B:
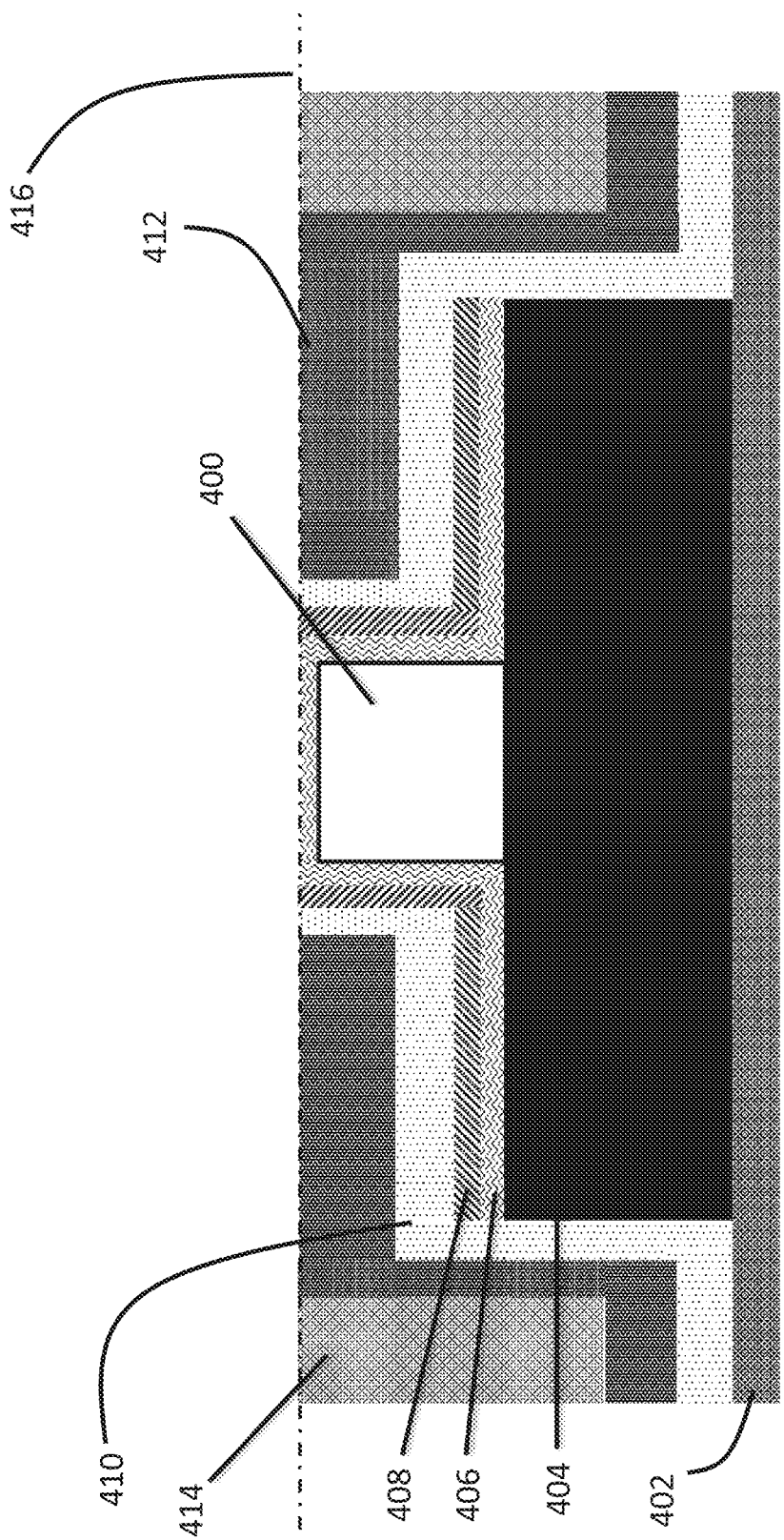
FIG. 4B shows a cross section of the same MTJ pillar of FIG. 4A, but after the CMP polishing has been stopped.
Figure 4C:
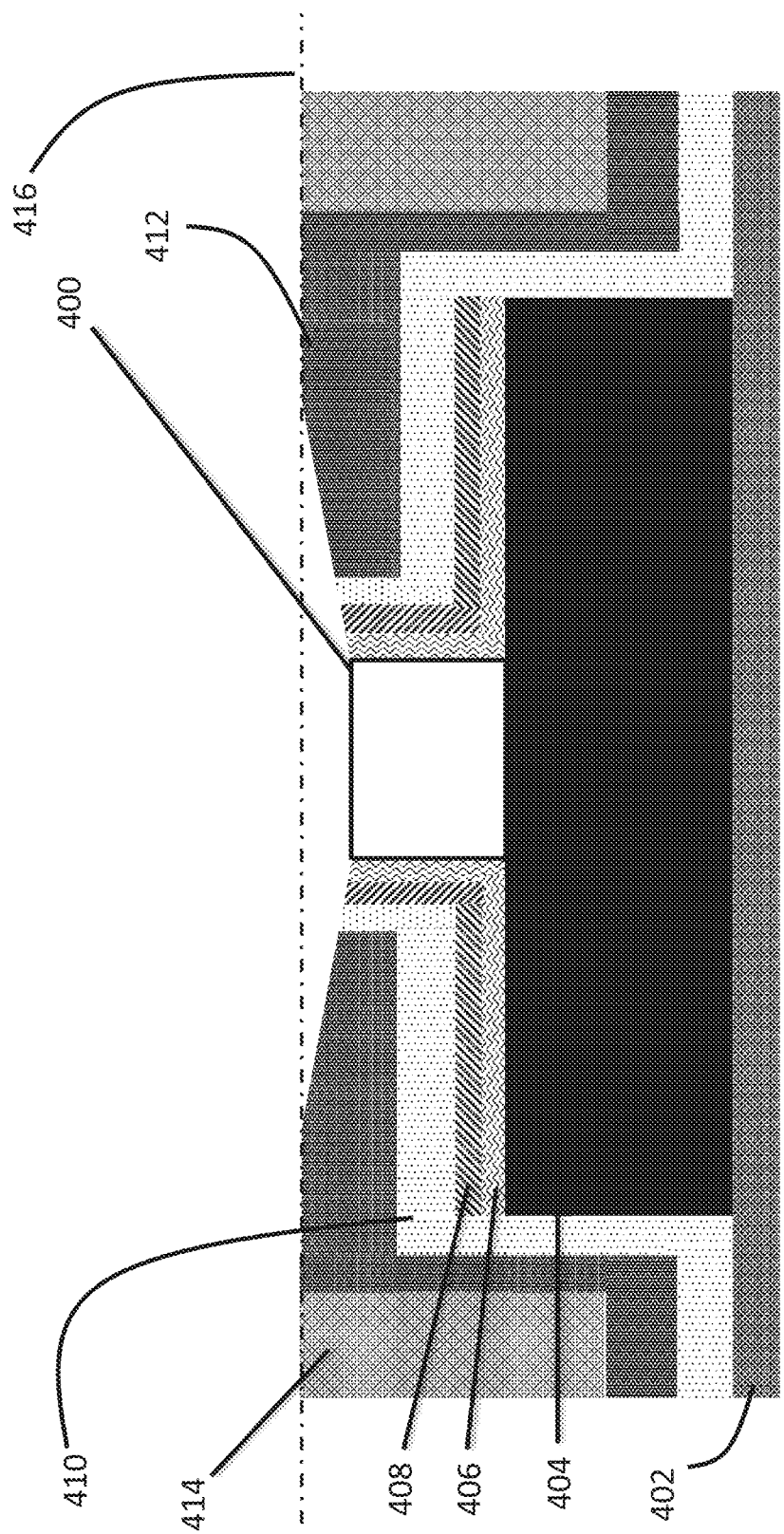
FIG. 4C shows the cross section of the same MTJ pillar of FIG. 4B, but after ion beam etching has been used to expose the top of the MTJ pillar.

FIGS. 4A, 4B, and 4C show an exemplary embodiment that sets the CMP stop-height above the MTJ pillar height. FIG. 4A depicts the MTJ pillar 400 fabricated on an electrode 404, which itself was fabricated on a wafer 402. In this embodiment, the process fabricates the MTJ pillar 400 on an electrode 404, which is fabricated on a wafer 402. The embodiment may sputter a first isolating layer 406 of SiOx onto MTJ 400. Thereafter, the embodiment may use a PECVD process to deposit a second isolating layer 408 of SiOx over the first isolating layer 406. Then, the embodiment may use PECVD to deposit a third insolating layer 410 of SiOx over the second isolating layer 408. Next, PVD may be used to deposit a fourth LR-CMP stop layer 412 of SiNx on top of the third isolating SiOx layer 410.

All of the layers have bump, side and valley regions. Of note is that the valley regions (418 and 420) of the fourth LR-CMP stop layer 412 are deposited to a CMP-stop height 416 that is above the top of the MTJ pillar 400. Thereafter the embodiment may use a PECVD process to deposit a fifth HR-CMP insulating layer 414 of SiOx over the fourth LR-CMP stop layer 412. FIG. 4A shows one fifth HR-CMP insulating layer 414 of SiOx deposited on top of the fourth CMP stop layer 312 of SiNx, but additional layers can be used. The same material need not be used for first three isolating layers (406, 408, 410), and the HR-CMP insulating layer 414, provided that HR-CMP insulating layer 414 polishes at a high rate in comparison to the LR-CMP material in the LR-CMP stop layer 412.

FIG. 4B depicts the same MTJ pillar 400 after the CMP process occurred, which has removed much of the bump, and been stopped at the CMP-stop height 416. In this embodiment, material from the first HR-CMP isolating layer 406 remains on top of MTJ pillar 400, which means that MTJ pillar 400 was not stressed by the CMP pad.

In this embodiment, however, because the portion of the first isolating layer 406 still covers MTJ pillar 400, another removal process needs to be performed to expose MTJ pillar 400. To expose MTJ pillar 400, additional removal may be done using a gentle IBE or RIE process.

FIG. 4C depicts the same MTJ pillar 400 after an IBE etch process has been performed, and exposes the top of the pillar. The IBE etch process directs ion beams at a substrate, which etches away the surface, including the bump region of the first HR-CMP isolation layer 406 which covers the top of MTJ pillar 400. Because the ion beams used during the IBE etch process are directed at the semiconductor wafer, portions of other layers, including the second HR-CMP isolation layer 408, the third HR-CMP isolation layer 410 and the LR-CMP stop layer 412 may also be etched away.

In tests, the CMP process required to obtain a result similar to that represented in FIG. 4B may occur after approximately 2.5 minutes of total CMP (1 minute initial CMP and 1.5 minutes of additional CMP) and the additional etching required to obtain a result similar to that depicted in FIG. 4C may occur after IBE is performed at 2 times 562 s IBE etch at 20 degrees. Such timing depends substantially on the thickness of the respective layers, the equipment used, and the settings of said equipment.

The IBE process can be made more robust by adding a thin layer of oxide, such as MgO (magnesium oxide) (not depicted), that can act as an IBE etch stop layer. The MgO allows the IBE process to stop quickly because once it is exposed, it provides a strong secondary ion mass spectroscopy (SIMS) signal, which may be used to stop the IBE process. The very thin layer of MgO may be placed in the appropriate location using various deposition techniques.

Figure 5:
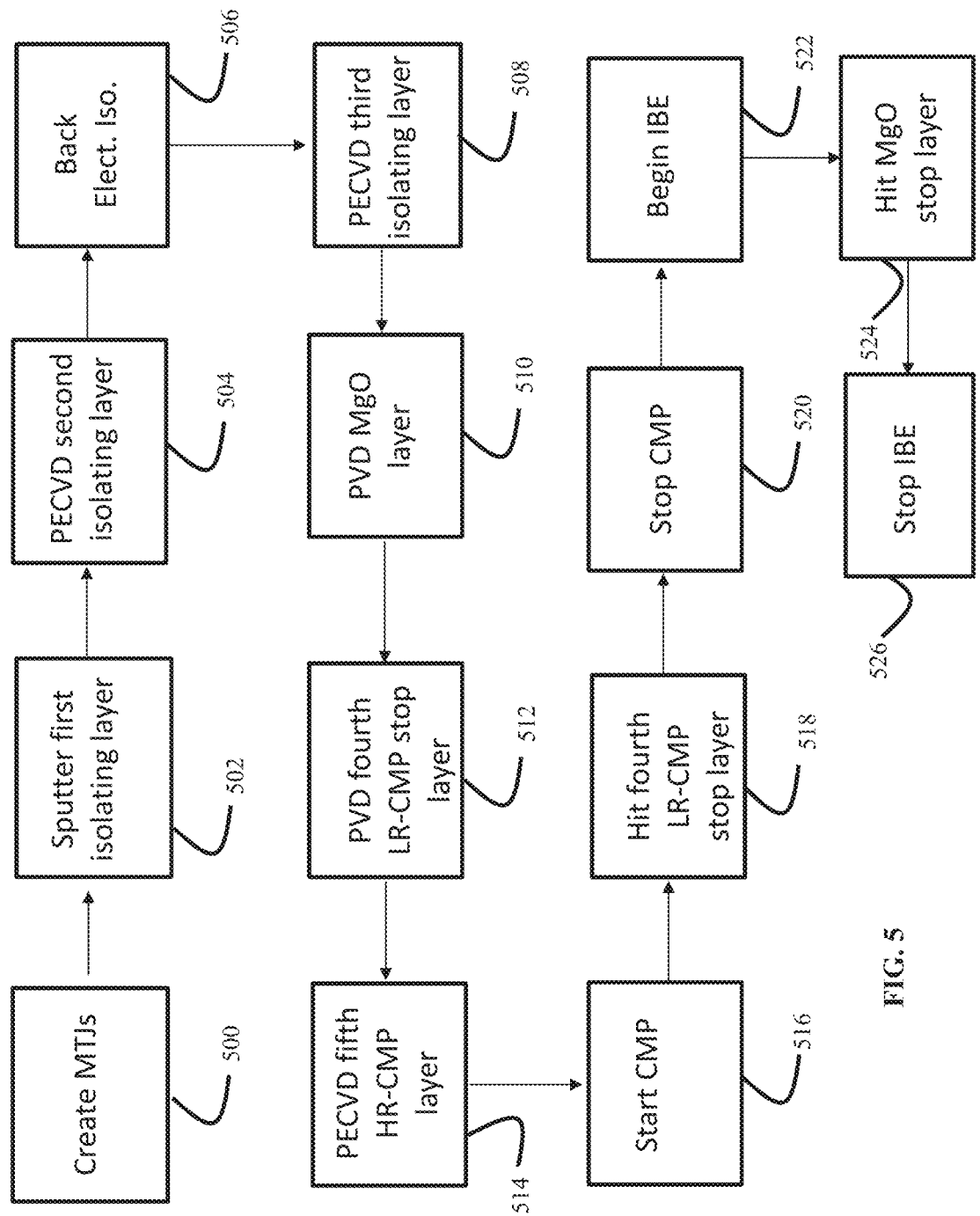
FIG. 5 shows the steps of an embodiment to deposit stop layers and other insulating layers.

FIG. 5 is a flow chart depicting some process steps in an embodiment described herein. Other embodiments may omit many of these steps, may perform the steps in a different order, may introduce other intervening steps, and may use other materials and deposition processes. At step 500, the embodiment fabricates the MTJ pillars on a CMOS wafer. One potential process for manufacturing MTJ pillars on a semiconductor wafer is disclosed in U.S. Pat. No. 9,263,667, the entirety of which is incorporated herein by reference. After MTJ pillars are fabricated in 500, the embodiment sputters a first isolating layer of SiOx (such as layers 206, 306, 406) onto the MTJs at step 502. At step 504, the embodiment uses a PECVD process to deposit a second isolating layer of SiOx (such as layers 208, 208, and 408). A back electrode isolation step 506 can then be performed. Thereafter, at step 508, the embodiment uses PECVD to deposit a third isolating layer of SiOx (such as layers 210, 310, and 410). Next, the embodiment can optionally deposit an IBE-etch stop layer of MgO at step 510. Then, at step 512, the embodiment uses PVD to deposit the fourth LR-CMP stop layer (such as 212, 312, and 412). In step 516, the embodiment uses PECVD to cover the fourth LR-CMP stop layer with a fifth HR-CMP layer (such as layers 314, and 414).

Once these layers have been deposited and prepared, the wafer may be subjected to CMP and etching to expose the tops of the pillars. At step 516, the embodiment starts one or more periods of CMP. As described above, the CMP process continues through the bump, side, and/or valley regions of various layers. At step 518, the CMP process encounters the valley regions of the fourth LR-CMP stop layer (such as 242, 244, 318, 320, 418, 420), and slows significantly. In response to the slowed CMP progress, at step 520, the embodiment stops CMP at the CMP-stop height (such as 214, 316, 416). At step, 522, the embodiment starts IBE process to remove the layers above the top of the MTJ pillar (such as the top region of layer 408). At the desired height below the top of the pillar, the IBE process exposes the thin layer of MgO at step 524, which provides a strong spectroscopy signal SIMS. In response to that signal, the embodiment stops the IBE process at step 526. Thereafter, any remaining manufacturing steps required to manufacture a complete MRAM device, including introducing electrodes that contact the top of each MTJ pillars (e.g. 200, 300, 400) can be performed.

By using a disclosed embodiment, numerous advantages are achieved. Using the embodiments in this application has been shown to result in improved resistance * area (RA) of the MTJ's, improved TMR values (allowing large readout signals), tighter property control as well as reduce exposure to possible shunts. These properties allow the use of this method for wafers with high areal density and smaller MTJ pillars. The described embodiments allow a uniform CMP process across the large area wafers (e.g., 200 or 300 mm), which is beneficial to manufacturing MRAM arrays on CMOS wafers.

Figure 1B:
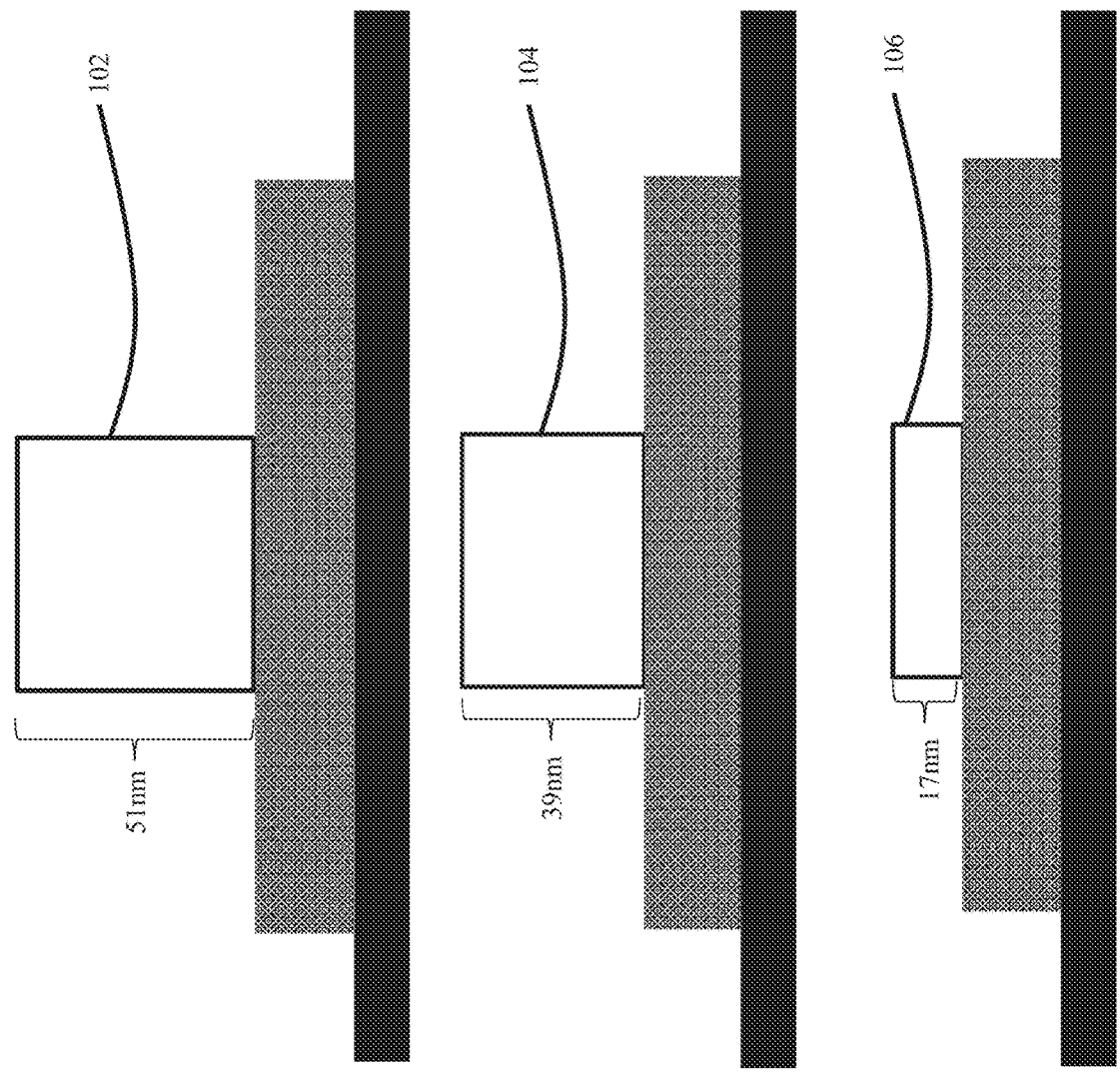
FIG. 1B shows cross section heights of three pillars from the MRAM wafer of FIG. 1A at the center, middle, and edge of the wafer that were produced without the methods of an embodiment of this patent.
Figure 6:
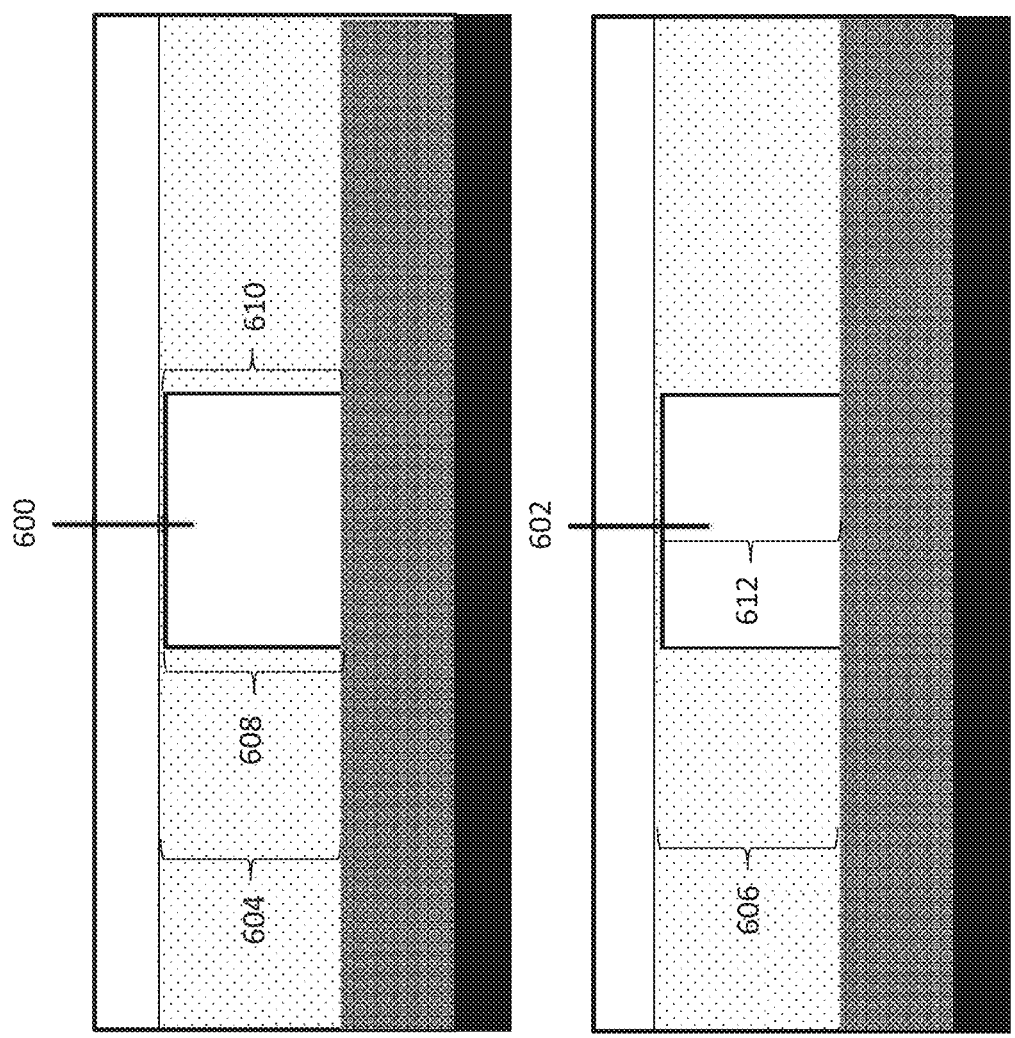
FIG. 6 is a representation of MTJ pillars taken from the center and edge of a wafer after processing with an embodiment.

For example, using the embodiments described herein, CMP end points are consistent across the wafer, which is illustrated in FIG. 6. For example, in contrast to FIGS. 1A and 1B where the CMP end point caused pillars ranging from 51 nanometers at the center of a wafer to 17 nm at the edge, applicants achieved a CMP stop height 604 of 83.10 nm for an MTJ pillar 600 at the center of the wafer and a CMP stop height 606 of 83.10 nm for an MTJ 602 at the edge of the wafer. In addition to consistency of the CMP stop heights 604 and 606, the height of MTJ pillars 600 and 602 themselves were consistent. For example, MTJ pillar 600 had a height 608 measuring 78.78 nanometers on one side and a height 610 measuring 75.54 nanometers on the opposite side. Similarly, MTJ pillar 602 had a height 612 measuring 73.38 nanometers.

As confirmed by these measurements, processing a wafer having MTJ pillars fabricated thereon using the methods described herein result in MTJ pillar heights at the center of a wafer that are similar to MTJ pillar heights at the edge of the same wafer (approximately 73-78 nanometers in thickness). This is a significant improvement over other methods. A person having ordinary skill in the art will recognize that the methods described herein can be used to make shorter pillars, down to approximately 20 nanometers, due partially to the reduced hard-mask necessary at the top of the pillar from the precise control of the CMP stop layer and IBE control. The shorter pillars allow denser arrays for advanced MRAM applications.

In addition to improvements in pillar size and CMP stop locations, the disclosed embodiments produce improved pillar properties for MTJs used in MRAM arrays. Desirable properties for MRAM arrays include high tunnel magnetic resistance values (TMR). High TMR values result when MTJ pillars are well formed and functioning and allow the MTJ pillars to give clear resistance readout signals. Low resistances (Rlow), that are well-separated from the high resistance values (Rhigh) are also desirable because they give good readout signals that clearly separate when a cell is designated as a "1" or a "0" in the MRAM array. As discussed below, manufacturing an MRAM device using the embodiments described herein improve these values.

Figure 7:
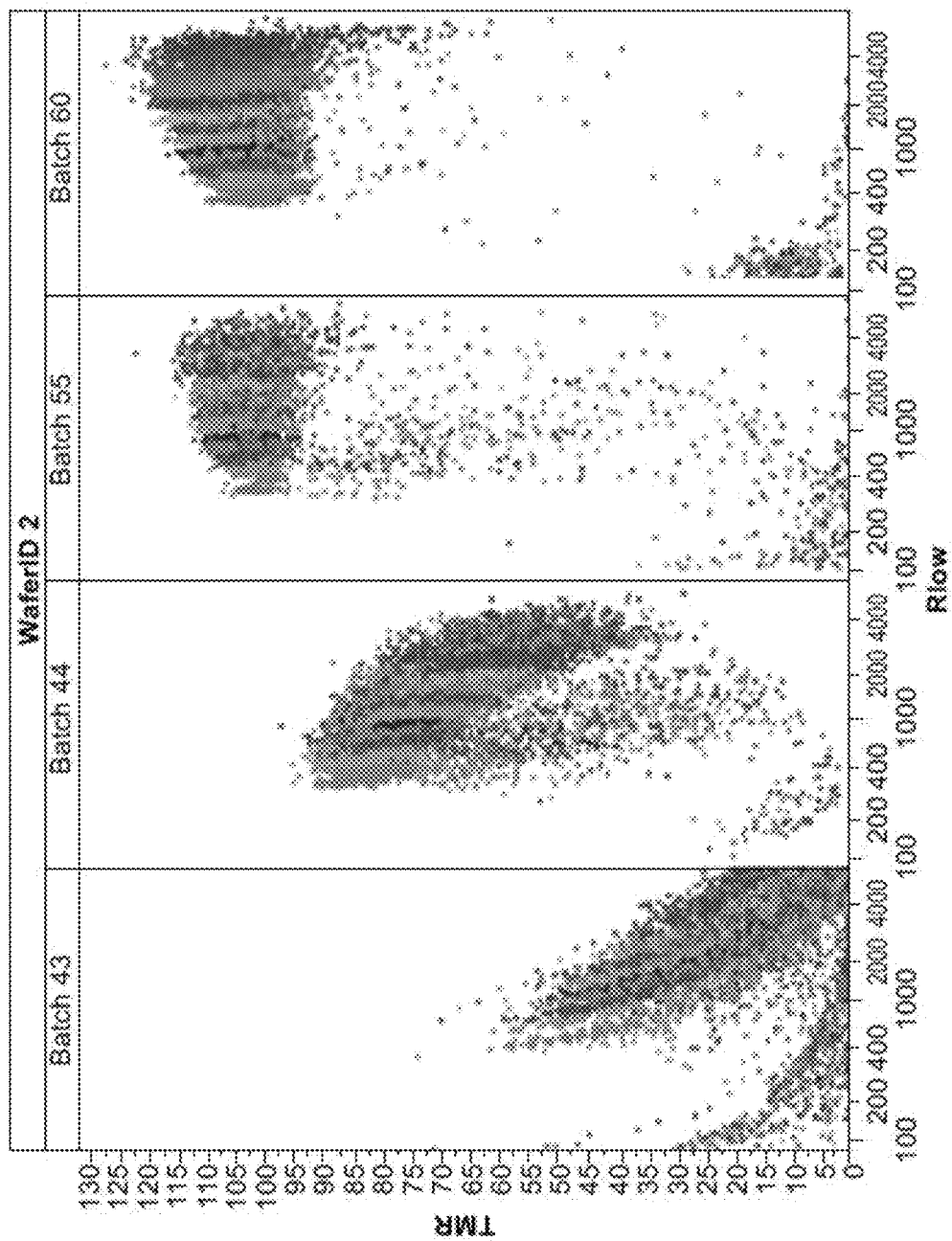
FIG. 7 depicts the improved TMR and Rlow properties of batches processed with an embodiment as compared to those processed without a CMP stop layer.

FIG. 7 shows the results applicant obtained for four batches processed with and without the elements of the disclosed embodiments. TMR values are plotted on the Y-axis, and Rlows plotted on a logarithmic scale on the X-axis.

Generally, batches 43, and 44 were processed without the use of the disclosed CMP-stop layer embodiments, and Batches 55, and 60 used the disclosed LR-CMP stop-layer.

As seen in FIG. 7, use of the LR-CMP stop layer significantly improved the TMR values for the MTJs, provided higher yield, and resulted in more pillars with acceptable Rlow and TMR values.

Figure 8A:
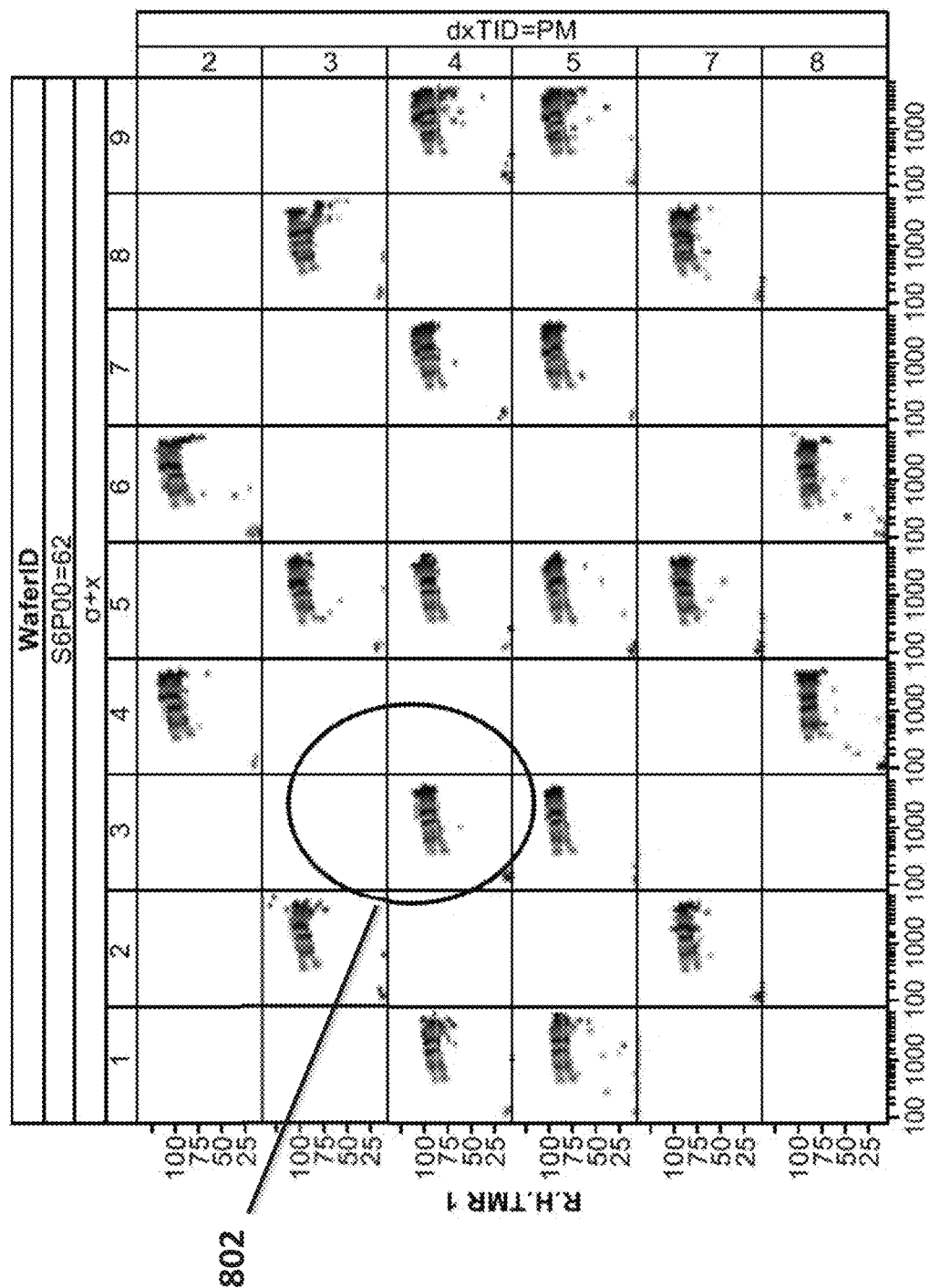
FIG. 8A depicts the individual chips of FIG. 7.

FIG. 8A depicts some of the chips that were aggregated to produce the data in Batch 60 from FIG. 7. Each cell shows the data from particular chips on a section of the wafer from Batch 60. As can be observed, good TMR values are observed in almost all of the MTJs. The circled chip 802, provides the data shown in the next figure, FIG. 8B.

Figure 8B:
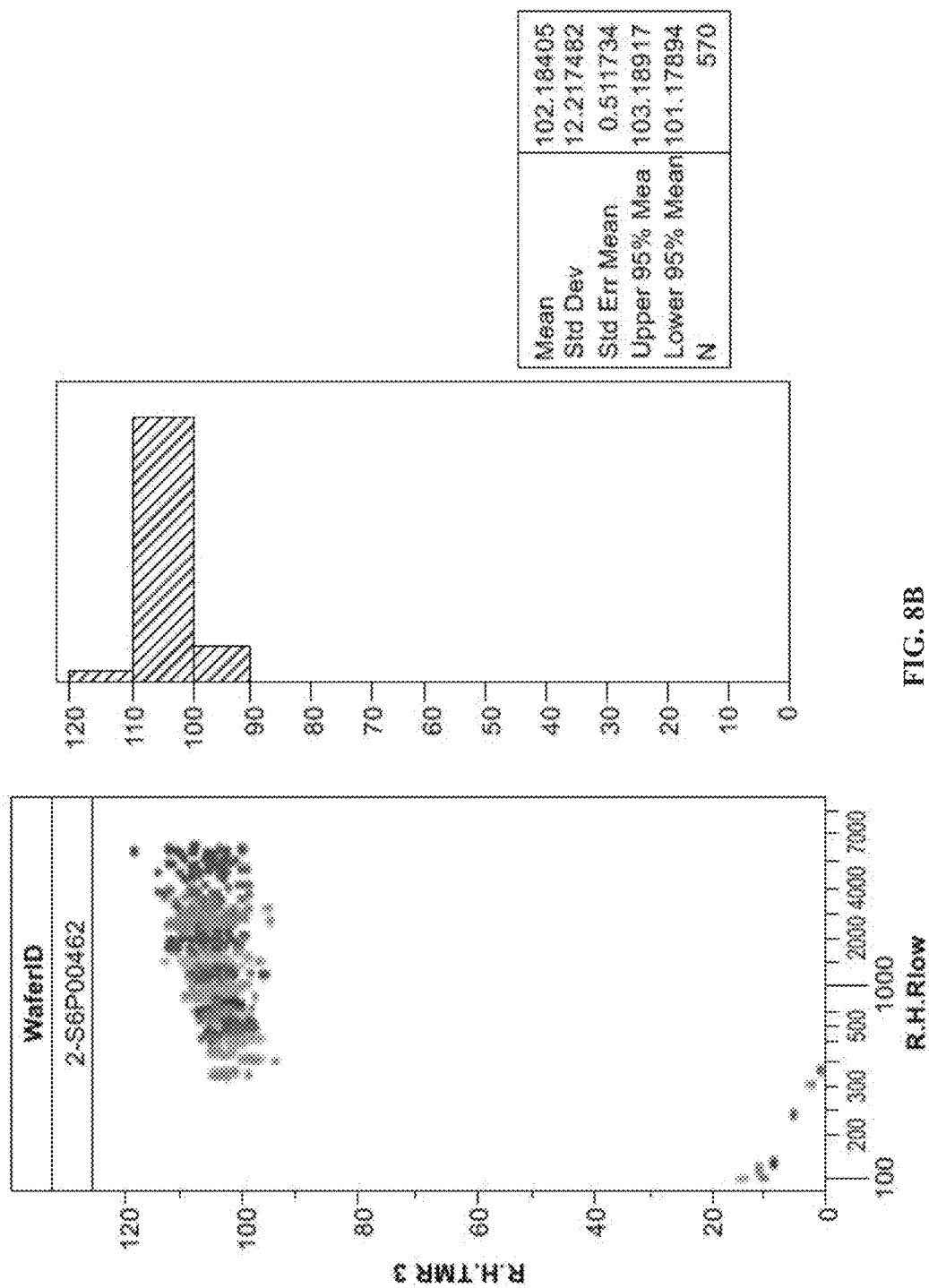
FIG. 8B shows the good TMR and RH loops that resulted when a chip was processed using an embodiment of this patent.

FIG. 8B shows the high TMR values and the RH (resistance vs. magnetic field) loops of the chip 802. In this instance 94% of the devices have a high TMR and 90% have good RH loops.

Figure 8C:
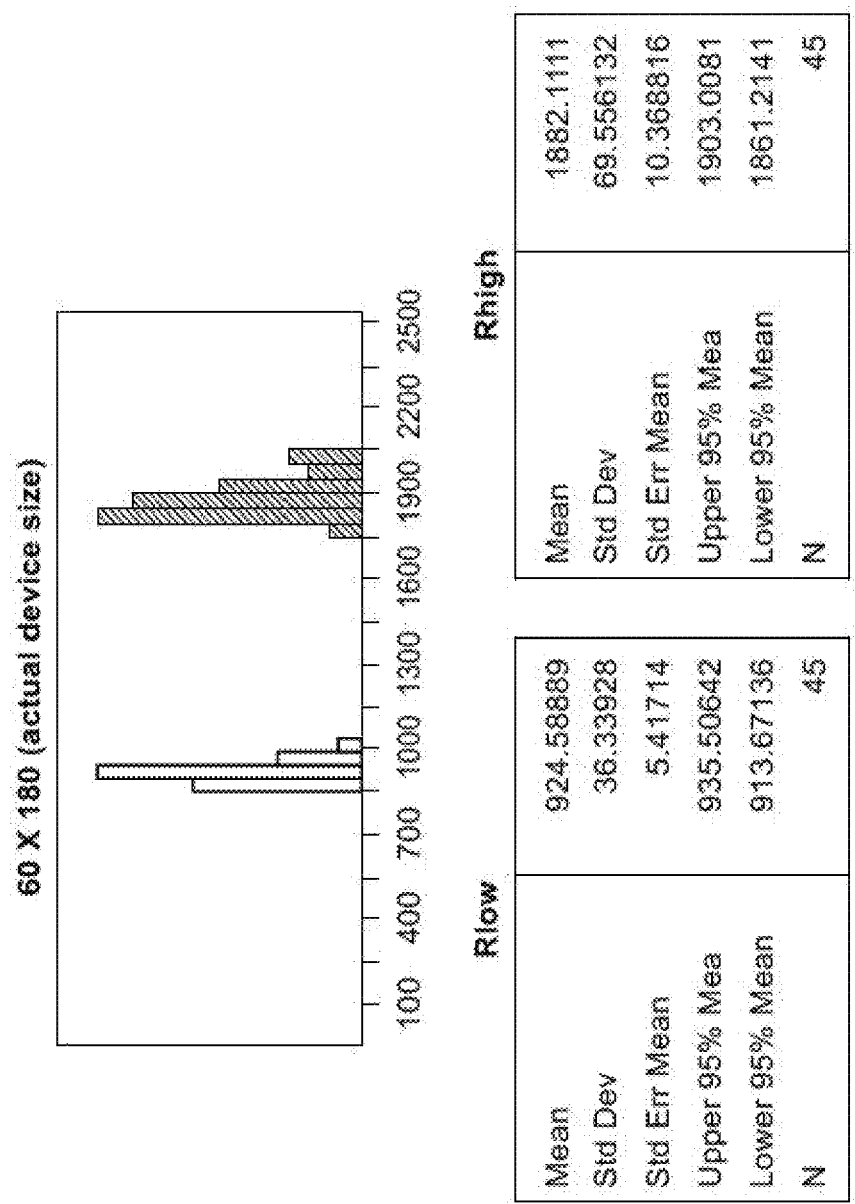
FIG. 8C shows the tight and well-separated Rlow and Rhigh values that resulted when a chip was processed using an embodiment of this patent.

FIG. 8C shows Rlows and Rhighs from the same chip. These provide good signals and, as can be readily observed, provide a tight and well separated Rlow and Rhigh distributions that create very clear "1" and "0"s for an MRAM array. Thus, the embodiments result in a large number of improved properties for MRAM applications.

A person of skill will understand that the above disclosure maps only particular embodiments. It should be further understood that intervening layers can occur even when one layer is described as having been placed over, is covering, or is on top of another layer. That understanding applies to the claims. It should be further understood that polishing may in some embodiments comprise etching processes. It should further be understood that while the MTJ pillars have been depicted in two-dimensional cross sections, they are three dimensional objects and the layers discussed may cover the three dimensional top, all sides, and all surrounding valley portions of the MTJ pillars.

The above description and drawings are only to be considered illustrative of specific embodiments, which achieve the features and advantages described herein. Modifications and substitutions to specific process conditions can be made. Accordingly, the embodiments in this patent document are not considered as being limited by the foregoing description and drawings.

What is claimed is:

1. A semiconductor device comprising:

a semiconductor wafer; a plurality of magnetic tunnel junction (MTJ) pillars thereon, each MTJ pillar comprising a plurality of layers and a hard-mask layer, the hard-mask layer having a bottom surface at a hard-mask bottom height, each MTJ pillar having a top surface and a side surface, the top surface extending at an MTJ pillar height from the wafer, the top surface of each MTJ pillar being exposed for electrical connection;

the semiconductor wafer with the plurality of MTJ pillars thereon having a first plurality of valley portions between the plurality of MTJ pillars;

a first nonmagnetic layer, the first nonmagnetic layer being comprised of a high chemical-mechanical polish (CMP) rate material, said first nonmagnetic layer comprising a first side portion over the side surface of each of the plurality of MTJ pillars and a second plurality of valley portions over the first plurality of valley portions between the plurality of MTJ pillars;

a second nonmagnetic layer, the second nonmagnetic layer being comprised of a high chemical-mechanical polish (CMP) rate material, said second nonmagnetic layer comprising a second side portion over the first side portion of the first nonmagnetic layer and a third plurality of valley portions over the second plurality of valley portions;

a third nonmagnetic layer, the third nonmagnetic layer being comprised of a high chemical-mechanical polish (CMP) rate material, said third nonmagnetic layer comprising a third side portion over the second side portion of the second nonmagnetic layer and a fourth plurality of valley portions over the third plurality of valley portions;

a fourth nonmagnetic layer, the fourth nonmagnetic layer being comprised of a high chemical-mechanical polish (CMP) rate material, said fourth nonmagnetic layer comprising a fourth side portion over the third side portion of the third nonmagnetic layer and a fifth plurality of valley portions over the fourth plurality of valley portions; and a fifth nonmagnetic layer, the fifth nonmagnetic layer being comprised of low chemical-mechanical polish (CMP) rate material, the fifth nonmagnetic layer comprising a fifth side portion the fourth side portion of the fourth nonmagnetic layer and a sixth plurality of valley portions over the fifth plurality of valley portions, each of the plurality of sixth valley portions of the fifth nonmagnetic layer having a top surface, the fifth nonmagnetic layer having a thickness such that the top surface of each of the sixth valley portions of the fifth nonmagnetic layer has a height above the hard-mask bottom height, the low CMP rate material having a lower polish rate than the polish rate of the high CMP rate material, the fifth nonmagnetic layer being nonmagnetic, wherein the side surface of each of the plurality of MTJ pillars are covered by the first nonmagnetic layer, the second nonmagnetic layer, the third nonmagnetic layer, the fourth nonmagnetic layer and the fifth nonmagnetic layer after the plurality of MTJ pillars were chemical-mechanically polished with a chemical-mechanical polisher.

2. The semiconductor device of claim 1, wherein the fifth nonmagnetic layer has a thickness such that the top surface of each of the third valley portions of the fifth nonmagnetic layer has a height equal to the MTJ pillar height, thereby exposing top surfaces of the plurality of MTJ pillars.

3. The semiconductor device of claim 1, wherein the fifth nonmagnetic layer has a thickness such that the top surface of each of the third valley portions of the fifth nonmagnetic layer has a height above the MTJ pillar height.

4. The semiconductor device of claim 1, wherein the first nonmagnetic layer, the second nonmagnetic layer, the third nonmagnetic layer and the fourth nonmagnetic layer are an insulator material.

5. The semiconductor device of claim 4, wherein the insulator material is SiOx.

6. The semiconductor device of claim 1, wherein the fifth nonmagnetic layer is an insulator material.

7. The semiconductor device of claim 6, wherein the insulator material is SiNx.

8. The semiconductor device of claim 1, further comprising a sixth nonmagnetic layer, the sixth layer being comprised of the high CMP rate material, the sixth layer comprising a side portion over each side portion of the fourth nonmagnetic layer.

* * * * *